(12) United States Patent
Pešić et al.

(10) Patent No.: US 11,997,936 B2
(45) Date of Patent: May 28, 2024

(54) OPTIMIZED SELECTOR AND MEMORY ELEMENT WITH ELECTRON BARRIER

(71) Applicant: Applied Materials, Inc., Santa Clara, CA (US)

(72) Inventors: Milan Pešić, San Jose, CA (US); Bastien Beltrando, Marseilles (FR)

(73) Assignee: Applied Materials, Inc., Santa Clara, CA (US)

( * ) Notice: Subject to any disclaimer, the term of this patent is extended or adjusted under 35 U.S.C. 154(b) by 2 days.

(21) Appl. No.: 17/010,155

(22) Filed: Sep. 2, 2020

(65) Prior Publication Data
US 2022/0069214 A1   Mar. 3, 2022

(51) Int. Cl.
  *H10N 70/00*   (2023.01)
  *G06N 3/063*   (2023.01)
  *H10B 63/00*   (2023.01)

(52) U.S. Cl.
  CPC .......... *H10N 70/841* (2023.02); *G06N 3/063* (2013.01); *H10B 63/00* (2023.02); *H10N 70/8833* (2023.02)

(58) Field of Classification Search
  CPC ... H01L 45/1253; H01L 27/24; H01L 45/146; H10N 70/841; H10N 70/8833; H10B 63/00
  See application file for complete search history.

(56) References Cited

U.S. PATENT DOCUMENTS

| | | |
|---|---|---|
| 2010/0314679 A1 | 12/2010 | Lee |
| 2012/0104482 A1 | 5/2012 | Kim et al. |
| 2012/0300535 A1 | 11/2012 | Schloss et al. |
| 2014/0367631 A1* | 12/2014 | Govoreanu ......... H01L 27/2418 257/4 |
| 2016/0093802 A1 | 3/2016 | Hou et al. |
| 2020/0058705 A1* | 2/2020 | Sharma ............... H01L 25/0657 |
| 2021/0066587 A1* | 3/2021 | Trinh .................... H01L 45/146 |

FOREIGN PATENT DOCUMENTS

| | | |
|---|---|---|
| CN | 104471735 A | 3/2015 |
| TW | 201007838 A | 2/2010 |
| TW | 201031260 A | 8/2010 |
| TW | 201618121 A | 5/2016 |

OTHER PUBLICATIONS

K. V. Rao et al., Dielectric Properties of Cobalt Oxide, Nickel Oxide, and Their Mixed Crystals, Journal of Applied Physics 36, 2031 (1965) (Year: 1965).*
J. Robertson, High dielectric constant oxides, Eur. Phys. J. Appl. Phys. 28, 265-291 (2004) (Year: 2004).*
International Search Report and Written Opinion dated Dec. 16, 2021 in International Patent Application No. PCT/US2021/047629, 8 pages.
Application No. PCT/US2021/047629 , International Preliminary Report on Patentability, Mailed On Mar. 16, 2023, 6 pages.

* cited by examiner

*Primary Examiner* — Shih Tsun A Chou
(74) *Attorney, Agent, or Firm* — Kilpatrick Townsend & Stockton LLP

(57) ABSTRACT

A device may include a first electrode, a barrier layer, and a tunneling layer having a first dielectric constant. The barrier layer may be between the first electrode and the tunneling layer. The device may also include an active layer having a second dielectric constant. The tunneling layer may be between the first electrode and the active layer. The device may further include a second electrode. The active layer may be between the tunneling layer and the second electrode.

20 Claims, 17 Drawing Sheets

OPTIMIZED SELECTOR AND MEMORY ELEMENT WITH ELECTRON BARRIER

TECHNICAL FIELD

This disclosure is generally directed to memory and selector devices for electronic applications. Specifically, this disclosure is directed to devices with tunneling layers, barrier layers, and active layers in various combinations to form devices with different electrical characteristics.

BACKGROUND

A modern electronic neural network includes digital and/or analog circuitry that is inspired by, and seeks to approximate, the biological neural networks used by neurological systems found in nature. Like their natural counterparts, electronic neural networks attempt to learn and perform various tasks and recognize input stimuli without being pre-programmed using tasks-specific rules. This learning process may be accomplished using a collection of connected nodes representing artificial neurons which operationally approximate the behavior of neurons in a biological system. Connections between neurons may approximate the behavior of biological synapses to transmit signals between one or more artificial neurons. Multiple successive layers of neuron-and-synapse connections can be chained together to break complex tasks down into incremental stages. Therefore, an electronic neural network can be taught to perform new tasks in the same way that biological neural networks learn and grow over time.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an FIG. 1 illustrates a diagram of a portion of a neural network, according to some embodiments.

DETAILED DESCRIPTION

Figure 1:
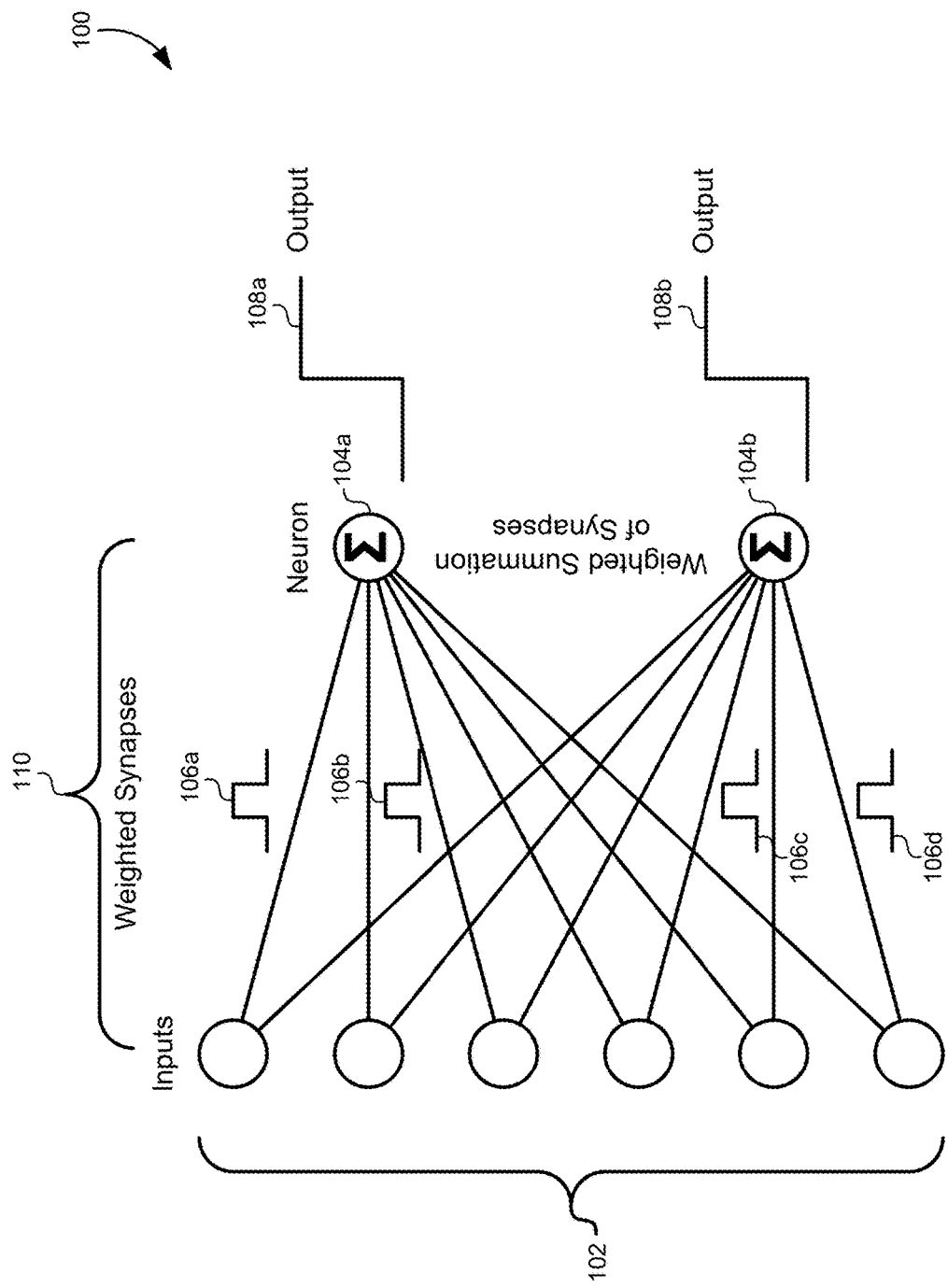

FIG. 1 illustrates a diagram of a portion of a neural network 100, according to some embodiments. The neural network 100 includes a plurality of inputs 102. The inputs may correspond to an input in a biological system, such as an axon representing a nerve fiber or a long slender projection of a neuron that conducts electrical impulses and acts as a transmission line in the nervous system. For example, the plurality of inputs 102 may represent axons tied to respective photoreceptors used to encode received light in the surrounding environment and transmit an electrical signal representing the received light. The electrical signal may be scaled to represent a magnitude or intensity of a received signal. For example, the plurality of inputs 102 may generate electrical signals that are proportional to an intensity of a received light signal. It should be noted that the use of photoreceptors and image recognition is provided merely by way of example and is not meant to be limiting. Other types of biological and electrical neural networks may be used to receive and process any type of input.

After receiving an input signal at the plurality of inputs 102, each of the plurality of inputs 102 may transmit pulses 106 to one or more neurons 104. The neural network 100 illustrates these pathways between the inputs 102 and the neurons 104 as a plurality of synapses 110. In a biological nervous system, a synapse is a structure that permits a neuron or nerve cell to pass an electrical or chemical signal to another neuron. In the neural network 100, biological synapses may be modeled using synapses 110 that pass a signal that is amplified/attenuated by synapse weights between the inputs 102 and the neurons 104 that represents the magnitude of the signal received by the inputs 102. The synapses 110 may also be weighted. For example, a single one of the plurality of inputs 102 may receive an input signal that is weighted differently by the synapses as it is sent to different neurons 104. The weighting of synapses 110 is what allows a neural network to "learn" to recognize specific input patterns and perform specific output tasks. When modeling the synapses 110 in a neural network, they may be represented by a semiconductor device that can receive a plurality of sequential input pulses and generate a corresponding output. For example, each input pulse may cause the synapse output to gradually increase between a logic 0 and a logic 1 level.

The synapses 110 may connect the inputs 102 to one or more neurons 104. These connections may be made in a one-to-many topology between the inputs 102 and the neurons 104. The neurons 104 in the neural network may be modeled after biological neurons, which are electrically excitable cells that communicate with other cells between connecting synapses. After receiving a sufficient number of input impulses, a neuron 104 may "fire" or transition into an excited state. The state may be associated with a sensory response (e.g., touch, sound, light, etc.) and/or motor controls from the brain. To approximate the behavior of a biological neuron, the neurons 102 in the neural network 100 may be implemented using any device that can receive a plurality of input pulses from one or more synapses 110, and after receiving a threshold number of input pulses, cause the outputs 108 of the neurons 104 to toggle between logic 0 and logic 1 states.

FIG. 1 illustrates a greatly simplified view of the neural network 100 in order to describe the various network components clearly. In practice, the neural network 100 may also include one or more hidden layer neurons and synapses between the inputs 102 and the outputs 108. These hidden or intermediate layers allow the task of generating the final outputs 108 to be broken down into sub-steps, each of which may be represented by a corresponding hidden layer of synapses and neurons. For example, the neural network 100 may be configured to distinguish between two different types of images, causing output 108a to fire when recognizing a first type of image, and causing output 108b to fire when recognizing a second type of image. A first hidden layer of neurons and synapses may recognize edges within the images. A second hidden layer of neurons and synapses may recognize shapes forwarded by the edges within the images. Finally, the neurons 104 in the output stage may combine the recognized shapes to distinguish between the first and second image types. Therefore, the neural network 100 may be far more complex in terms of electrical components and connections than may be readily apparent in FIG. 1. Because of the size, complexity, speed requirements, and/or routing difficulties that may accompany complex modern neural networks, there is a great need for circuit elements that can represent biological neurons and synapses in a way that can still allow for efficient layout and fabrication of many devices on a single technology node.

A neural network represents only one of many applications that may utilize the memory and selector devices described in detail below. It should be understood that the example of a neural network is not meant to be limiting, but provides just one example of an operating environment that may benefit from the low-power characteristics of these devices.

Figure 2:
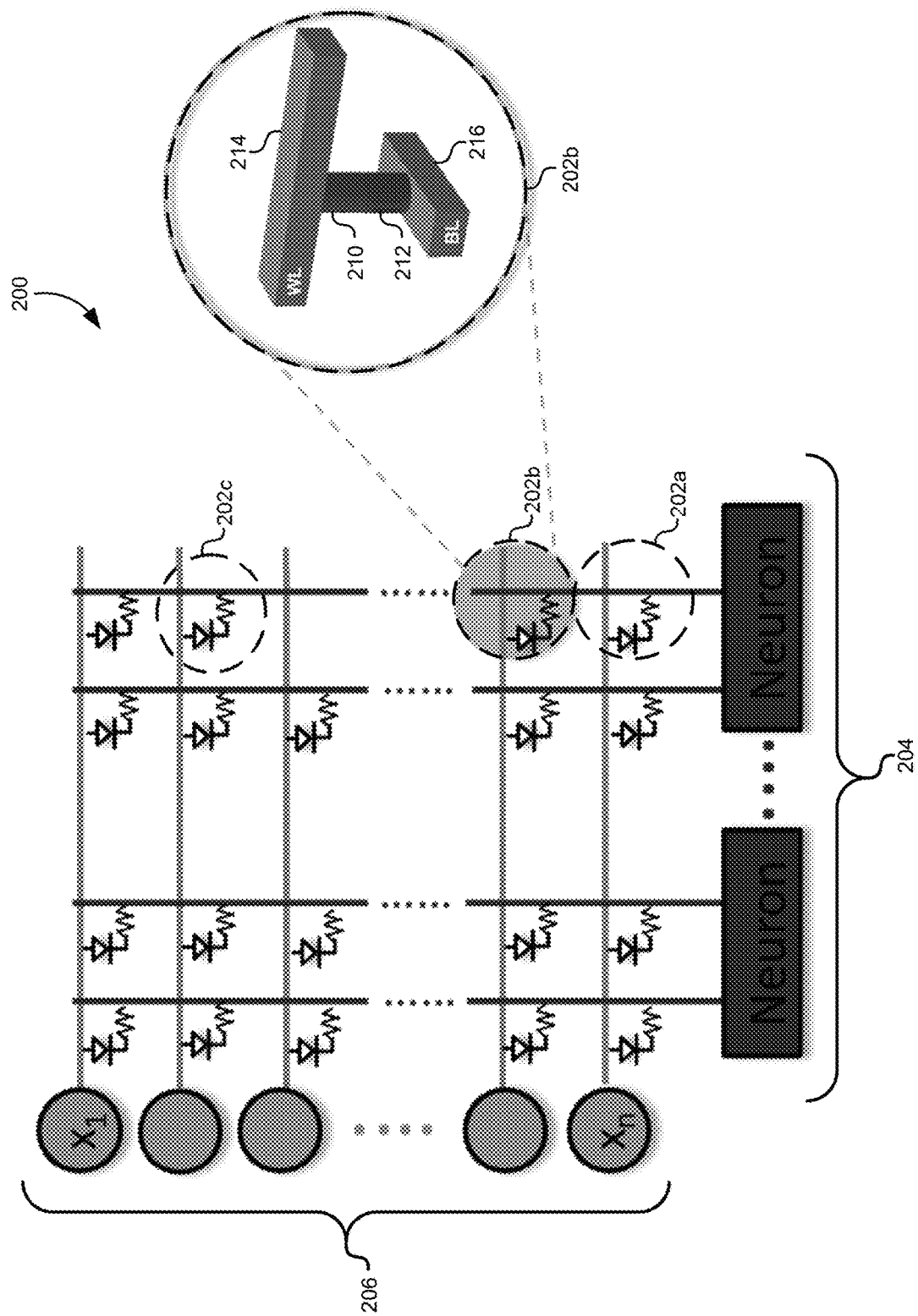
FIG. 2 illustrates a circuit network that implements a neural network, according to some embodiments.

FIG. 2 illustrates a memory circuit network 200 that implements a neural network, according to some embodiments. The neural network represented by the circuit network 200 may be similar to the neural network 100 in FIG. 1. As was the case for FIG. 1, FIG. 2 is a simplified view of a simple neural network where many connections and/or hidden layers may have been omitted for the sake of clearly describing the various circuit components that can be used to represent neurons and synapses. The circuit network 200 includes a plurality of inputs 206 that may correspond to the inputs 102 of FIG. 1. The inputs may be connected to a plurality of devices representing neurons 204 through devices representing synapses 202.

Many different devices may be used to represent synapses in the circuit network 200. In some embodiments, the synapses 202 may be implemented using semiconductor devices that can receive a plurality of input pulses and provide a proportional output to the neurons 204. Additionally, the neurons 204 may also be represented by discrete circuit devices. However, in contrast to the synapses 202 that gradually change their conductance with arriving excitation pulses, the neurons 204 may be configured to receive a plurality of pulses from the synapses 202 and fire after threshold number of pulses have been received. This basic network of circuit connections between the inputs 206 and the output neurons 204 may be augmented using hidden layers of transistors and/or other two-terminal resistive devices representing hidden layers of neurons and synapses as described above. When implementing the circuit network 200, it therefore may be beneficial to use semiconductor devices that can implement both the analog behavior of the synapses and the digital behavior of the neurons.

In some embodiments, many different types of devices may be used to implement the basic components of a neural network. For example, some embodiments may use a specific type of transistor known as a ferroelectric field-effect transistor (FeFET). A FeFET is a logic transistor that can maintain its logical state even when power is removed. FeFETs are similar to traditional metal oxide silicate (MOS) transistors, except that the logic gate dielectric is replaced with a ferroelectric material, which is a dielectric that "remembers," or stores electric fields to which it has been exposed. In a FeFET, a persistent dipole may be formed within the gate dielectric itself, thereby splitting the threshold voltage of the FeFET into two stable states that can represent binary logic states. Other embodiments may use ferroelectric FinFET devices.

In the embodiments described herein, the synapses may be represented by individual two-terminal memory elements. When using memory devices to model synapses, the circuit network 200 may be viewed as a form of non-volatile memory array. Each of the memory elements representing synapses 202 may be arranged in a rectangular grid pattern. In some embodiments, the grid pattern may be three-dimensional such that multiple grids lie above and below each other, as in a crosspoint memory array. Each of the memory elements may be configured to receive an applied voltage, and based on the polarity of the applied voltage, the memory elements representing the synapses 202 may change a physical state of a material in the memory element to represent a saved logic state, such as a logic 1 and a logic 0. When the voltage is no longer applied, the memory elements 202 may save the logic state induced by the applied voltage, and thus may operate as non-volatile memory elements.

In order to apply the voltage needed to read/write to the memory elements, signals may be received from the horizontal lines from the plurality of inputs 206. These horizontal lines may act as a word line in a traditional memory array. The bit lines may run in a perpendicular direction and connect to the output neurons 204. Therefore, applying a voltage between a single one input of the word lines and a single input of the bit lines may cause voltage to be applied across a single one of the memory elements representing synapses 202. This process can be used to select a single synapse 202 for a read and/or write operation.

FIG. 2 illustrates a detailed view of a single synapse 202b. This synapse 202b shows a word lines 214 and a bit lines 216 coupled to a selector device 210 and a memory device 212. To minimize the leakage current through the circuit network 200, and to isolate memory elements connected on the same word/bit lines, the synapse 202c may each include the selector device 210. The selector device 210 may be implemented between the memory device 212 and the word line 216. The selector device 210 may be used to reduce current from leaking through an individual memory element (i.e. synapse 202b) and the leakage and power dissipation of the whole array, as well as to prevent disturbances while a synapse is passively addressed to access a cell/synapse on the same bitline/wordline (unless a desired memory element/synapse is selected and sufficient voltage above the selector threshold is received by the synapse 202b). Therefore, when the voltage is applied to the word line 214 and the bit line 216, the synapse 202b is accessed while the selector devices in synapse 202a and synapse 202c may prevent their associated memory devices from being affected by the voltage on the shared bit line 216. Although not shown explicitly in FIG. 2, three-terminal selecting devices may also be used, such as transistors, to form a 1T-1C cell.

Many different technologies may be used to implement the memory device 212, such as phase-change memories (PCMs), oxide-resistive random-access memory (oxRRAMs) or conductive-bridging memories (CBRAM) to name a few. The embodiments described herein may use a specific type of memory device known as a resistive random-access memory (ReRAM). A ReRAM is a type of non-volatile, random-access computer memory that operates by changing a resistance across a dielectric solid-state material. Generally, filamentary ReRAM devices generate oxygen ion/vacancy pairs in an oxide layer. These oxide ions/vacancies can subsequently conduct electrical current while oxygen ions can drift under an electric field. The motion of oxygen atoms through these vacancies in the oxide is similar to the motion of electrons and holes in a traditional semiconductor device. Applying a voltage to the ReRAM device generates these oxide vacancies to decrease the resistance of the device. When the voltage is removed, the oxide vacancies may remain in place and thereby store a nonvolatile state of the conductance level of the ReRAM device.

Some specific ReRAM devices may be referred to as bulk ReRAM devices. Bulk ReRAM devices may change a conductance state by moving species (vacancies, ions, etc.) from one side to other side of the device. Bulk ReRAM devices may be used to mimic the specific type of synaptic behavior in a neural network as described above. Specifically, bulk-switching ReRAM devices may exhibit an analog response to received input pulses. As more input pulses are received by the device, the mobile species may gradually start to move from one part of the device to other part of the ReRAM device, and consequently the resistance of the device will gradually decrease. By gradually applying voltage pulses to the ReRAM device, the conductivity of the ReRAM device may be modulated in an analog fashion depending on the polarity, frequency, and duration of the applied voltage pulses. When used in this fashion, ReRAM devices may provide a very compact circuit footprint for mimicking synaptic behavior in the circuit network 200.

Figure 3A:
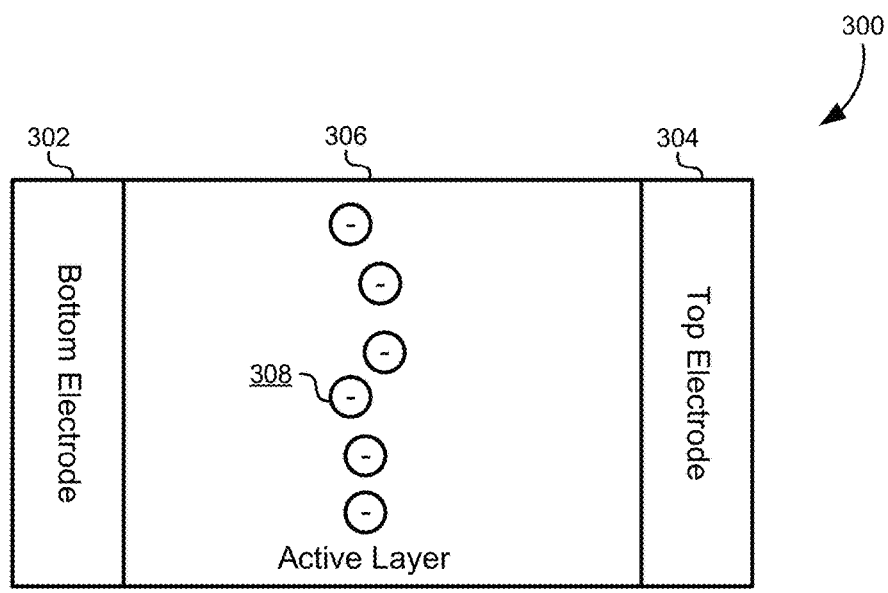
FIG. 3A illustrates an active region of a memory device that may be used in a neural network or other memory circuit, according to some embodiments.

FIG. 3A illustrates an active layer of the memory device 300 between two electrodes that may be used in a neural network or other memory circuit, according to some embodiments. The active layer of the memory device 300 may represent a bulk switching memory device that operates by applying a voltage between a pair of electrodes to move a mobile species in an active layer that is deposited between the two electrodes. A top electrode 304 and a bottom electrode may be formed using any type of metal or other conductor. Some embodiments may preferably metals characterized with a relatively high work function, such as greater than approximately 5 eV. The terms "top" and "bottom" may be interchangeable between the two electrodes, and these terms are merely used to distinguish between the two electrodes and not necessarily to imply order or location. When a voltage is applied on the bottom electrode 302 and/or on the top electrode 304, defects, ions and other mobile species may move in an active layer 306 to modulate the energy barrier as seen by the electrons and holes between the bottom electrode 302 and the top electrode 304. The barrier may be transparent to electrons/holes and allow current to flow through the active layer of the memory 300 by means of quantum mechanical tunneling. For example, when the active layer of the memory device 300 is in the energetic state depicted with FIG. 3B with the mobile/charged species in the middle, the barrier seen by electrons and holes may be relatively high. Consequently, the barrier transparency and tunneling current may be relatively low and have a high resistance value. This may represent a logical 0. When the active layer of the memory 300 includes ions (or any other mobile species) that have drifted to one of the electrode interfaces, the barrier is shifted as shown in FIG. 4B, and a high barrier transparency and high tunneling current result to provide a low resistance value. This may represent a logical 1.

Figure 3B:
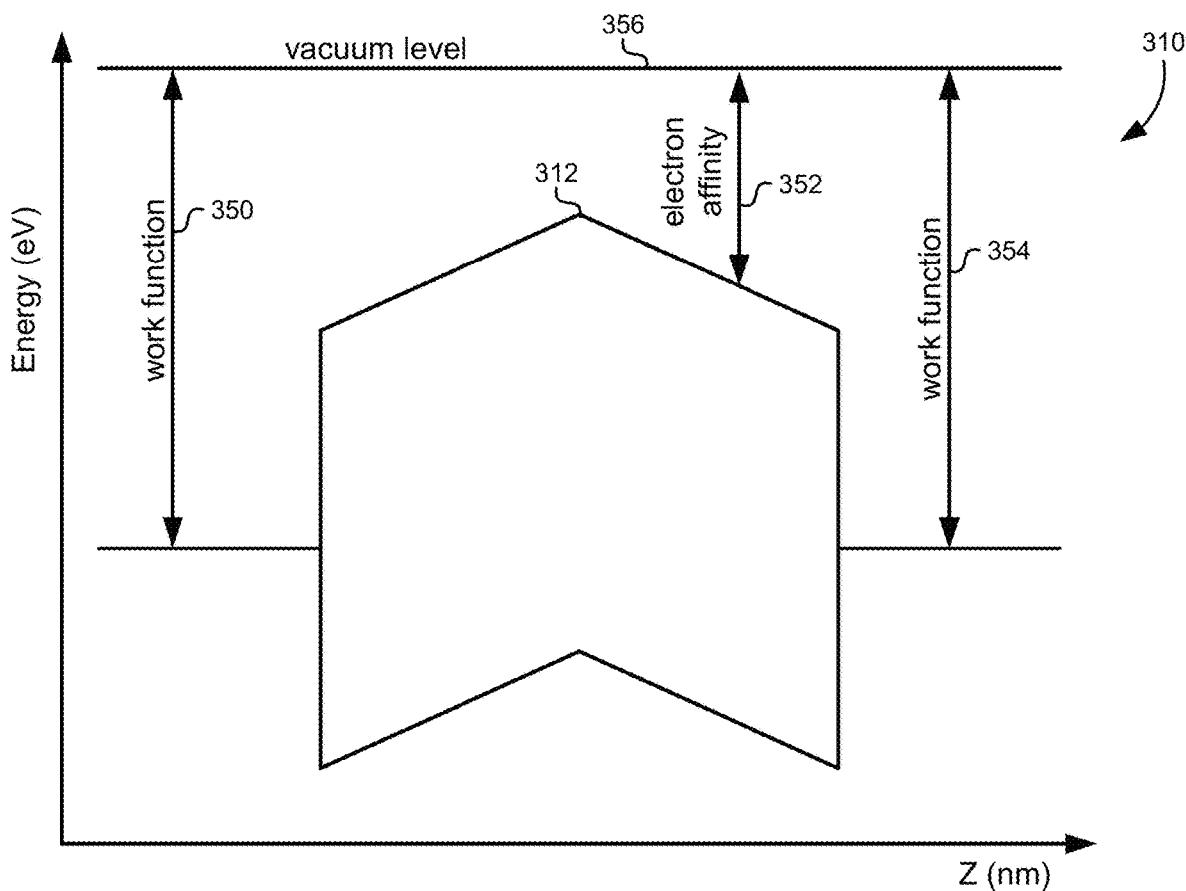
FIG. 3B illustrates a band diagram illustrating the energy levels of an active layer throughout the thickness of the memory device, according to some embodiments.

FIG. 3B illustrates a band diagram 310 illustrating the energy levels of an active layer throughout the thickness of the active layer of the memory 300, according to some embodiments. The band diagram 310 is drawn to scale relative to the active layer of the memory device 300 in FIG. 3A. For example, a peak 312 in the center of the band diagram 310 may correspond to the center of the active layer 306 of the memory device 300. Similarly, the non-electrode portion of the band diagram 310 begin/end such that the non-zero portion of the band diagram 310 lies between the bottom electrode 312 and the top electrode 304.

The active layer of the memory 300 may include a plurality of ions (or any other charged, mobile species, such as oxygen vacancies) 308 in the active layer 306. The active layer 306 may be formed using any transitional metal oxide (TMO) with high ionic mobility—or any TMO doped with other material incorporated in host lattice—having a relatively high dielectric constant and a relatively high defect and ionic mobility. This may include any electrolytic material that uses an electric field for charged species movement. For example, some embodiments may use titanium oxide and doped titanium oxide as an active layer 306. The ions 308 may include negative oxygen ions or positively charged oxygen vacancies that reside between the crystal lattice of the titanium oxide in the active layer 306. Without a voltage being applied across the bottom electrode 302 on the top electrode 304, the ions or any other mobile species 308 may reside near the center or at any other position of the active layer 306. The location of the mobile species 308 is illustrated by the peak 312 of the band diagram 310 that increases as the ions 308 are approached, then decreases as the band diagram 310 moves from the bottom electrode 302 to the top electrode 304. In some embodiments, the position of the mobile species 308 may be associated with a logical 0 for the memory active layer 300.

The energy levels of the various regions of the band diagram 310 may be characterized according to a vacuum level 356. Each of the electrodes 302, 304 may be characterized by a work function 350, 354 defining the energy to be transferred to the electron to ionize the electron to the vacuum level. The work function difference between the electrodes 302, 304 and the vacuum level 356 may represent a work function differential between the two electrodes. The work function differential between the two electrodes may generate an internal field that is inversely proportional to the thickness of the dielectric layer therebetween. This work function differential may be used in some embodiments (described below) to stabilize the retention state of the memory element or to destroy the memory state of the memory element and create a selector semiconductor device. Similarly, the energy level of the active layer 306 may be characterized by an electron affinity 352 defining the energy difference between the conduction band of the active layer 306 and the vacuum level 356.

Figure 4A:
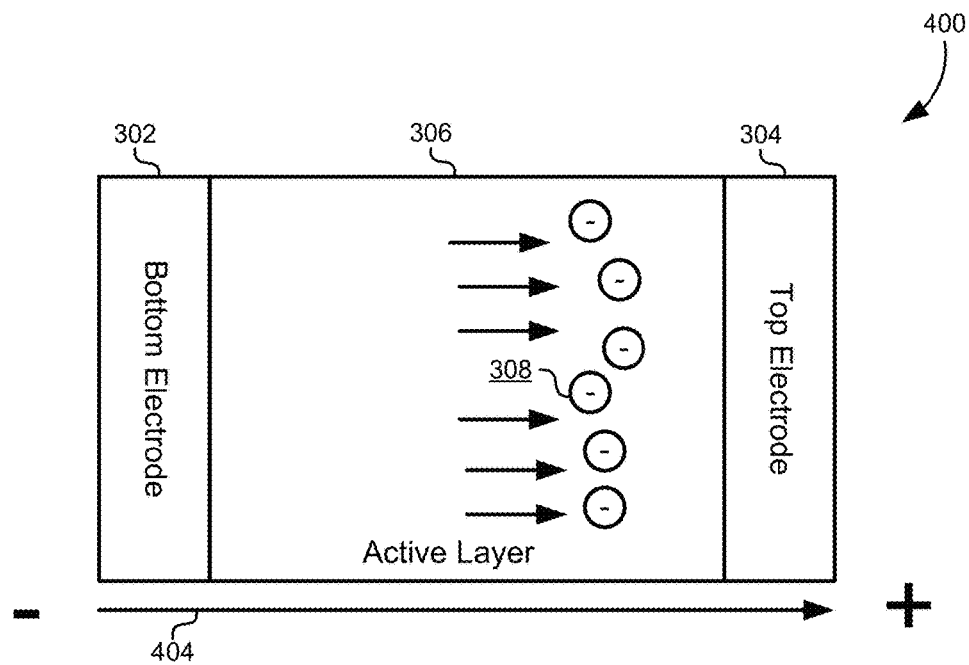
FIG. 4A illustrates a memory device with an applied voltage, according to some embodiments.
Figure 4B:
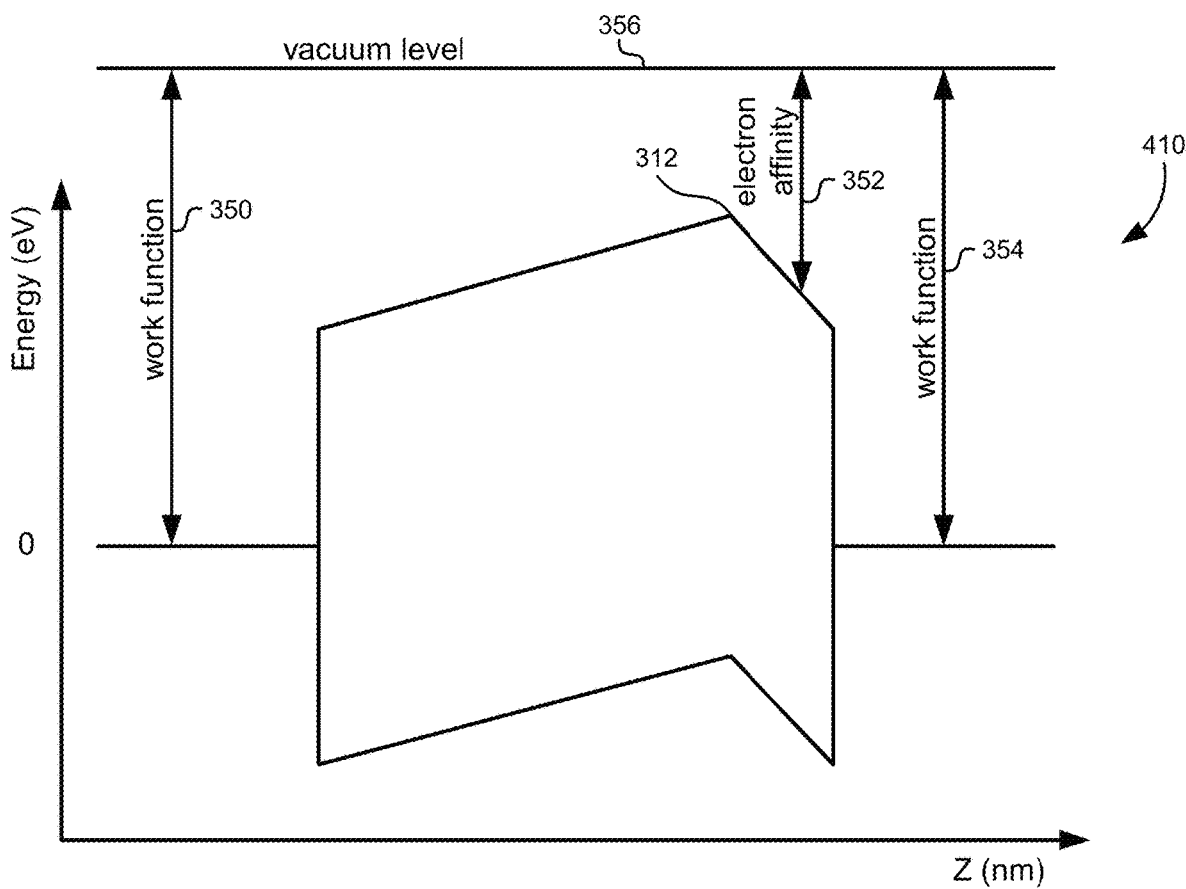
FIG. 4B illustrates a band diagram of the memory cell generated in response to the applied voltage, according to some embodiments.

FIG. 4A illustrates an active layer of the memory device 400 between two electrodes with an applied voltage 404, according to some embodiments. The voltage 404 may be applied on the bottom electrode 302 and/or on the top electrode 304. Under the influence of the voltage 404, the ions (or any other charged mobile species) 308 in the active layer 306 may move towards the electrode 304. As illustrated in FIG. 4A, negatively charged ions are attracted by the positive polarity caused by the voltage applied on the top electrode 304. Similarly, positive oxygen vacancies (not shown) may move away from top electrode as they are repelled by the positive polarity applied on the top electrode 304. As the ions 308 move towards the top electrode 304, the tunneling barrier may change its transparency (i.e., increase the tunneling probability) in the active layer 306, and the state of the active layer of the memory 400 may be associated with a logical 1.

FIG. 4B illustrates a band diagram 410 generated in response to the applied positive voltage 404 on the top electrode 304, according to some embodiments. The shift of the position of the ions (or any other charged mobile species) 308 in the active layer 306 of the active layer of the memory 400 may be reflected in a shift in the peak 312 of the band diagram 410 to the right. Again, this shift may be caused by the application of the voltage 404 across the active layer of the memory 400. However, while the mobility of the ions 308 is relatively high during the application of the voltage 404, the mobility of the ions 308 decreases significantly when the voltage is removed. This causes the position of the ions 308 to remain near the top electrode 304 rather than immediately drifting back to the center of the active layer 306. This causes a shift in the band diagram of tunneling barrier 410 that persists even after the voltage 404 has been removed.

Figure 5A:
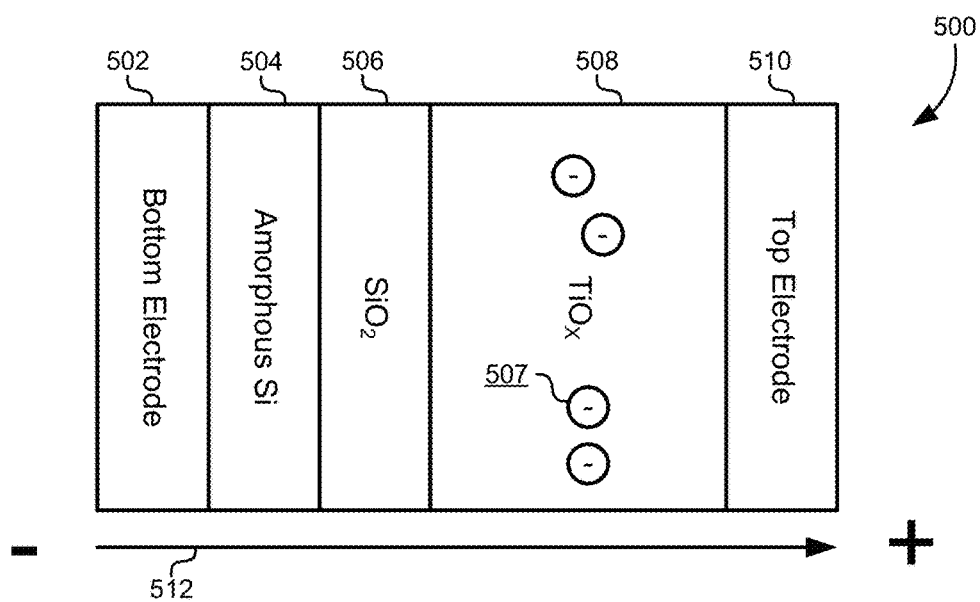
FIG. 5A illustrates a combination memory and selector device, according to some embodiments.

FIG. 5A illustrates a combination memory and selector device 500 with a current-voltage graph is discussed in FIG. 5, according to some embodiments. This device 500 includes a bottom electrode 502 and a top electrode 510. Instead of simply including a single active region as described above, this device 500 includes an amorphous silicon layer 504 next to the bottom electrode 502. Amorphous silicon may describe the non-crystalline form of silicon. Instead of forming a uniform monocrystalline or polycrystalline structure, amorphous silicon may form a continuous random network of molecules. Next to the amorphous silicon layer 504, a barrier layer of silicon dioxide ($SiO_2$) 506 may be deposited. Between the layer of silicon dioxide 506 and the top electrode 510, an active layer of titanium oxide ($TiO_x$) 508 may be deposited. The active layer 508 may include ions 507 as described in the devices above.

The active layer 508 may be between approximately 6 nm and approximately 13 nm thick. For example, the active layer 508 may be 6 nm, 8 nm, 9 nm, 10 nm, 11 nm, 12 nm, 13 nm, and/or the like in width. The combined width of the amorphous silicon layer 504 and the silicon dioxide layer 506 may be between approximately 1 nm and approximately 5 nm. For example, the combined width may be between approximately 1 nm-2 nm, 2 nm-3 nm, 3 nm-4 nm, 4 nm-5 nm, and/or the like. The amorphous silicon layer 504 may act as a selector device, the silicon dioxide layer 506 may act as a barrier layer, and the titanium oxide layer 508 may act as an active layer. This creates a combined selector and memory device (i.e., a self-rectifying memory device) with a barrier.

Figure 5B:
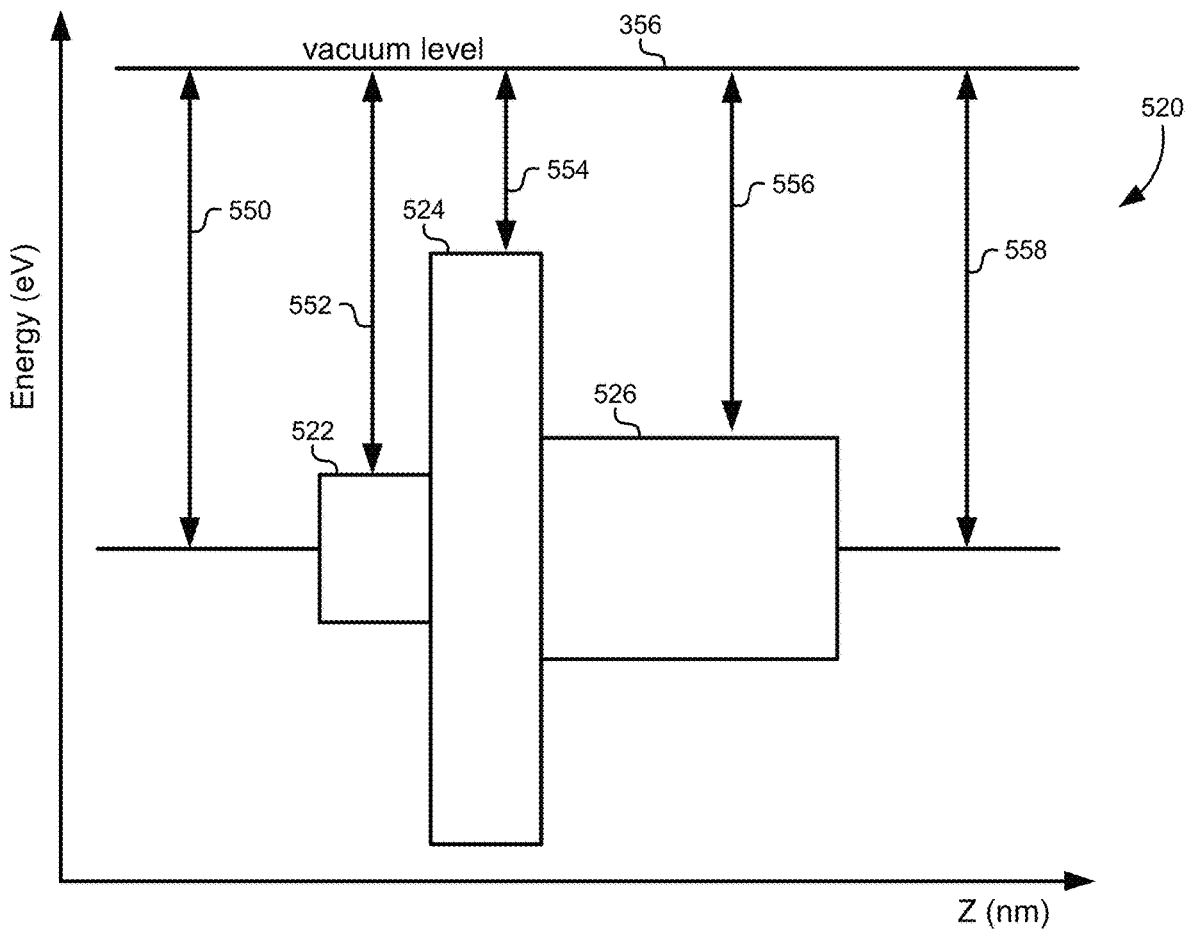
FIG. 5B illustrates a band diagram for the combination memory and selector device for a self-rectifying memory cell, according to some embodiments.

FIG. 5B illustrates a band diagram 520 for the combination memory and selector device 500 for a self-rectifying memory cell, according to some embodiments. The energy barrier 522 attributable to the amorphous silicon layer 504 is relatively small in comparison to the much larger energy barrier 524 formed by the silicon dioxide layer 506. This barrier 524 allows the device to act as a selector, while the ions and filament formed in the active layer 508 allowed the device to act as a memory. The band diagram 520 illustrates the work functions 550, 558 for the electrodes 502, 510. The band diagram 520 also illustrates the electron affinity 552 for the amorphous silicon layer 504, the electron affinity 554 for the silicon dioxide layer 506, and the electron affinity 556 for the active layer 508.

Figure 6:
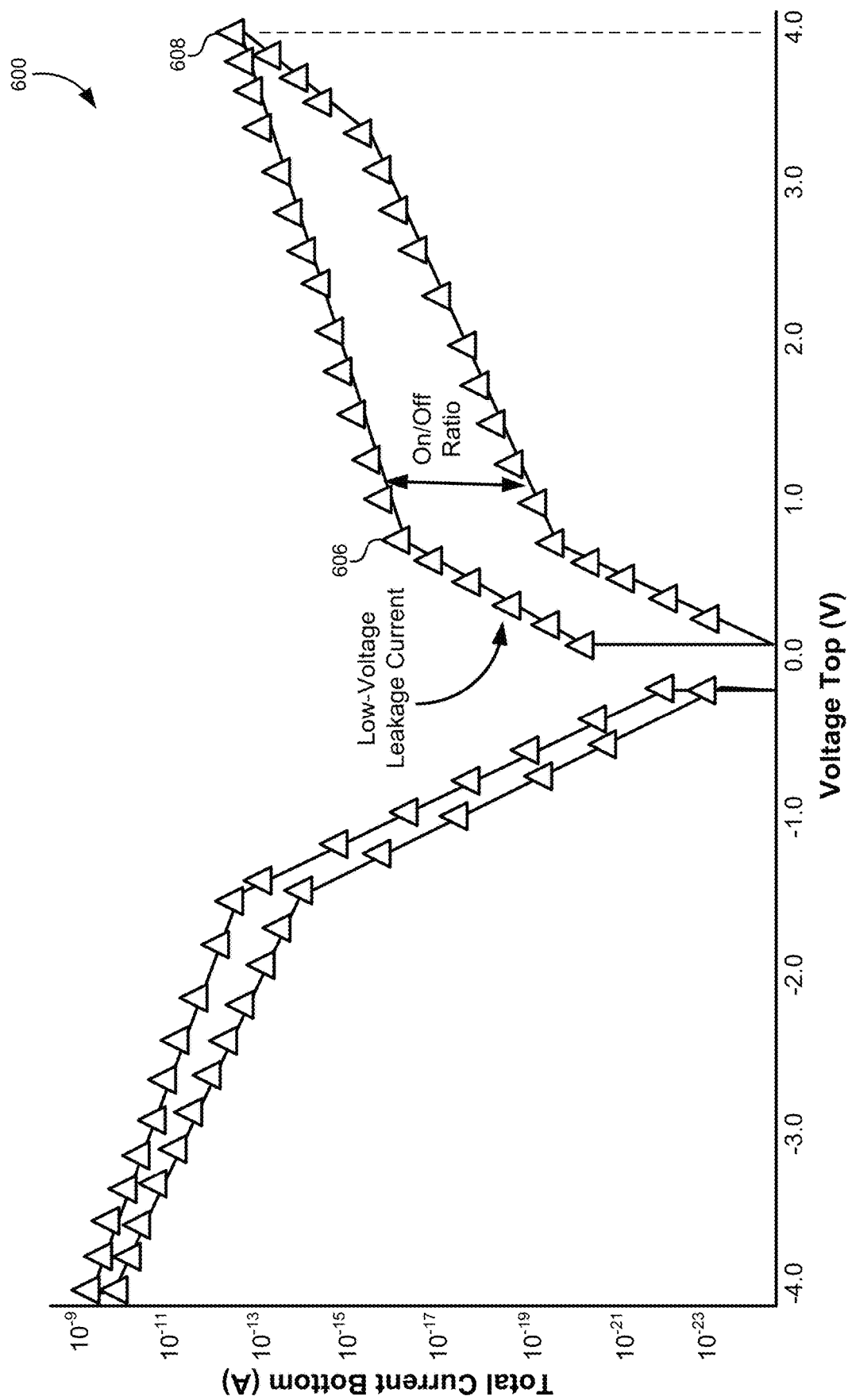
FIG. 6 illustrates a voltage/current graph for a memory cell with a discrete barrier layer and a separate active layer and selector, according to some embodiments.

FIG. 6 illustrates a voltage/current graph 600 for a memory cell with a discrete barrier layer and a separate active layer and selector, according to some embodiments. The graph 600 illustrates how the leakage current through the prior-art memory device increases rapidly with small increases in voltage. Recall from above that small voltages may be applied across the selector/memory element combination in a neural network. As illustrated in FIG. 6, a small increase of less than one volt may cause an increase in the magnitude of the current 606 of more than $10^5$ A. Turning back to FIG. 4B, this leakage current may be caused in part by at least two factors. First, the barrier between the top electrode 304 and the active layer 306 is simply too small. The energy difference is small enough that electrons can too easily cross the barrier and conduct through the active layer 306. In addition, previous implementations may use highly reactive amorphous silicon (aSi), which grows a parasitic $SiO_2$ layer and causes a rise in inherent variability and leakage. This also increases the thickness of the barrier layer, which causes the majority of the voltage drop across the device and undesirably increases the operation condition of the memory cell. Furthermore, Ti has much higher oxygen compared to $SiO_2$, which results in oxygen scavenging of the barrier layer and increases the leakage of other known devices. The embodiments described herein solve this and other problems by introducing new device characteristics, designs, materials, and fabrication processes that shift the rise in leakage current to the right in graph 600. This allows small voltages to be applied to the device without increasing the leakage current significantly to the level shown in FIG. 6.

An additional problem with the memory device described above is that the voltage level required to cause the movement of ions from one position in active layer to another position is approximately 4 V or higher, as illustrated by the voltage at point 608 in graph 600. The embodiments described herein also shift the peak voltage at point 608 required to move ions in the device to the left (e.g., to lower voltages), thus compressing the clockwise and counterclockwise voltage path illustrated in the graph 600. This allows the device to be fully operated with lower voltage levels, thus reducing the power required for the memory array or neural network as a whole. While the performance is improved over the devices described in the figures above, this device 500 still has a number of drawbacks that prevent it from being optimal for use in neural networks. Specifically, the device 500 does not exhibit a high degree of selectivity. The current increase is still too abrupt and large as a small amount of voltage is applied across the device, which leads to a large leakage current when devices around the device 500 are activated in the neural network. Additionally, as illustrated in FIG. 6, the voltage required to change the resistance (or "tunneling transparency") may still be approximately 4 V or higher, which may be too high for many future low-power memory designs and advanced nodes.

Some of the embodiments described herein modify the design of the memory and selector device 500 to improve the voltage/current characteristics such that it can be optimally used in neural networks. One such modification that may be made is to adjust the relative thickness of the amorphous silicon layer 504 and the silicon dioxide layer 506. A number of different thickness ratios between these two layers 604, 606 may be used, such as 0.5:2.5 nm, 1.0:2.0 nm, 1.5:1.5 nm, 2.0:1.0 nm, 2.5:0.5 nm, and so forth. As the thickness of the silicon dioxide layer 506 is increased, the ON/OFF ratio of the device 500 may be greatly increased, and the current level of the top portion of the voltage/current curve (transitioning from 0 to 1) may be decreased. This increases the selectivity of the device and lowers the leakage current for lower voltages that may be applied to the device in a neural network.

Specifically, without the silicon dioxide layer 506 acting as a barrier, the electrons would jump directly from the selector layer formed by the amorphous silicon layer 504 into the active layer 508. The interaction of aSi and $TiO_x$ may result in the parasitic formation of $SiO_2$, which may result in a parasitically generated barrier, which in turn may increase the performance variability of the device. As the thickness of the barrier formed by the silicon dioxide layer 506 increases, the magnitude of the current at the top of the curve illustrated in FIG. 6 drops. Conversely, as the thickness of the barrier formed by the silicon dioxide layer 506 decreases, the magnitude of the current increases. If the thickness of the barrier becomes too thin, electrons begin to readily tunnel through the barrier between the amorphous silicon layer 504 and the active layer 508.

Figure 7A:
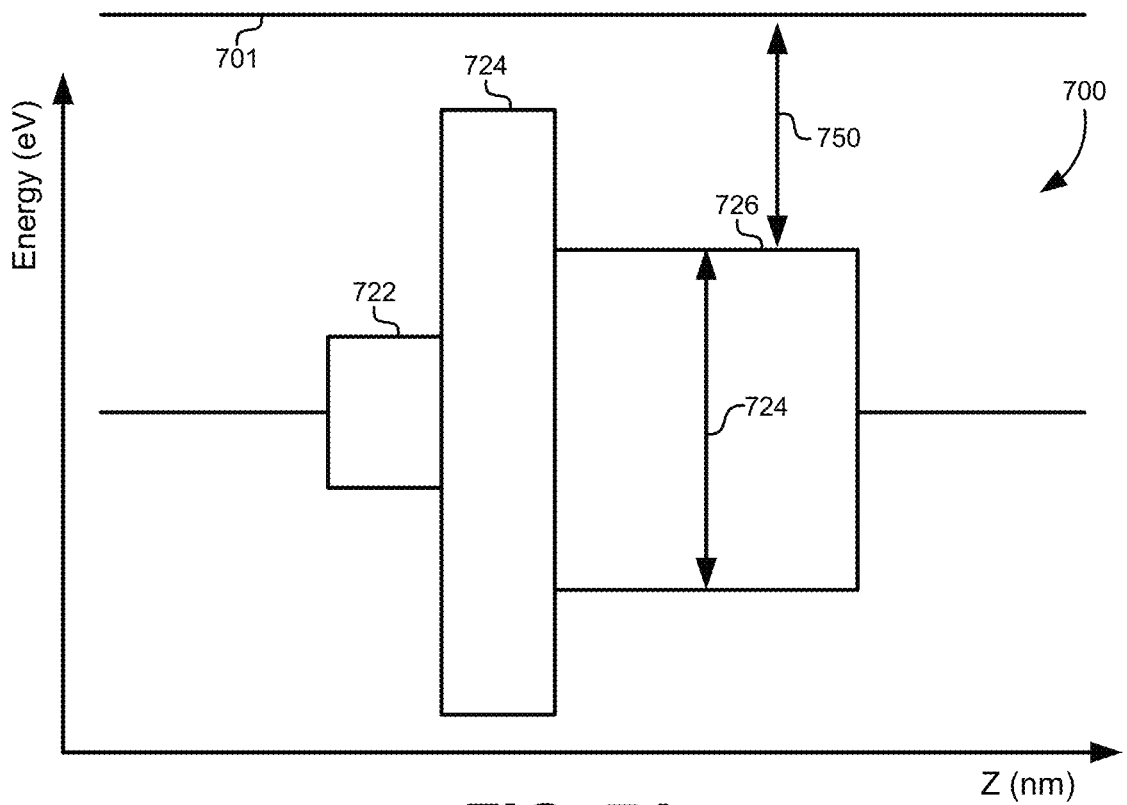
FIG. 7A illustrates a band diagram for adjusting the doping of the memory and selector device or self-rectifying memory cell, according to some embodiments.

FIG. 7A illustrates a band diagram 700 for adjusting the doping of the memory and selector device 600 or self-rectifying memory cell, according to some embodiments. Another change that may be made to the device 600 in order to increase the selectivity of the device and decrease the leakage current is to change the electron affinity in the active region. The electron affinity 750 is the amount of energy required to be added to an electron to cause it to free itself from the crystalline lattice of the active layer. The electron affinity 750 is illustrated in FIG. 7A as the difference between the energy band 726 for the active layer and the vacuum level 701. The electron affinity 750 can be adjusted by increasing or decreasing the bandgap energy 724, represented by the thickness of the band 726 for the active region.

The bandgap energy 724 has been found to be a function of the doping of the active layer. Specifically, the ratio of titanium to oxygen in a dopant material strongly influences the bandgap energy 724. In FIG. 7A, the bandgap energy 724 of the active layer may be increased by increasing the amount of oxygen relative to the amount of titanium in the active layer. For example, when depositing the titanium oxide during a manufacturing process, the oxygen inflow can receive more power than the titanium inflow, thus creating a mix with more oxygen than titanium. This ratio can be tightly controlled to finely tune the bandgap energy 724 to the desired level. Additionally, the bandgap, electron affinity, and alignment of the energy bands can be tuned by doping the active layer 726 with other materials, such as Co, C, Cr, Mo, W, C, N, Nb, Ta, Zr, Hf, S, Se, P, and/or the like. Some embodiments may use chromium oxide, cerium oxide, and/or any other multi-oxidation state oxide. Some embodiments may use combinations of $TaO_x/HfO_2$ instead of $TiO_x$ as an active layer material.

Figure 7B:
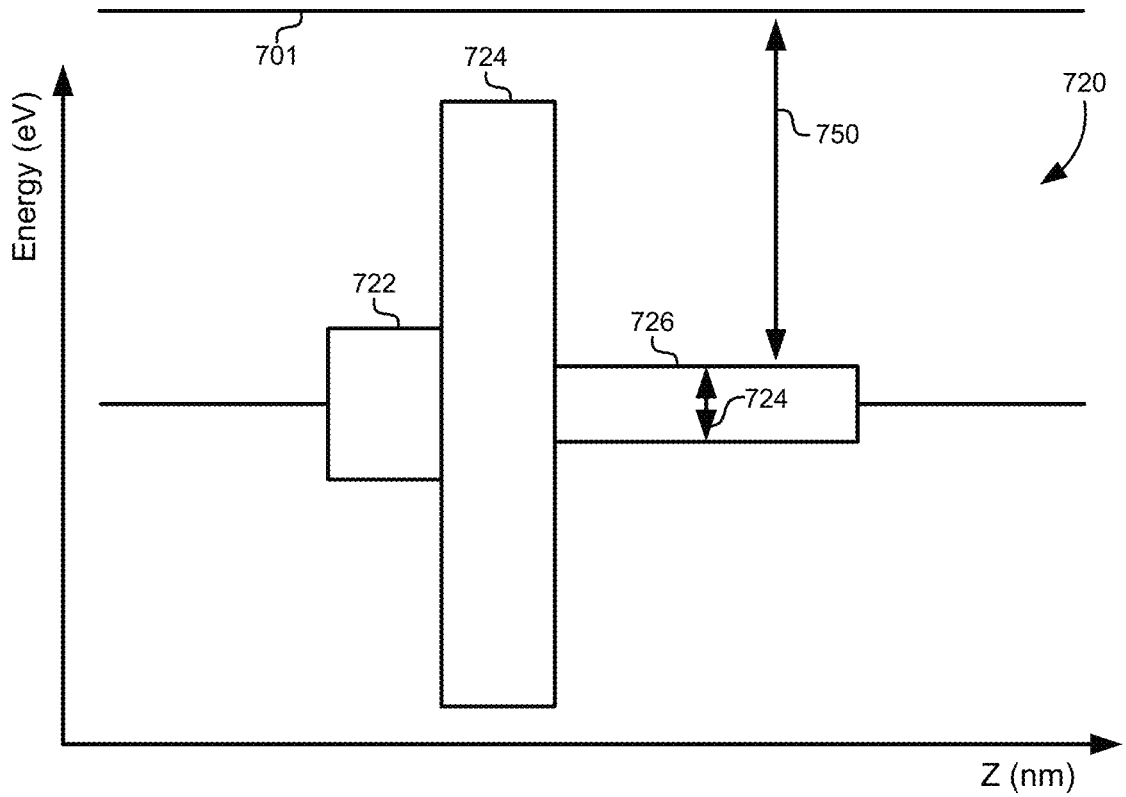
FIG. 7B illustrates a band diagram for a self-rectifying memory cell with a decreased bandgap in the active layer, according to some embodiments.

FIG. 7B illustrates a band diagram 720 for a self-rectifying memory cell with a decreased bandgap energy 724 in the active layer, according to some embodiments. To decrease the bandgap energy 724, the amount of titanium in the active layer can be increased relative to the amount of oxygen. When depositing the titanium oxide during the manufacturing process, the titanium inflow can receive more power than the oxygen flow, thus creating a mix with more titanium than oxygen. As titanium increases, the bandgap energy decreases. (If the oxygen were completely eliminated and the active layer included primarily titanium, the bandgap energy 724 would conceptually shrink to in effect extend the zero-level energy of the top electrode.) In some embodiments, the doping level of the active layer may be controlled by changing the material used for the adjacent electrode (e.g., the top electrode). For example, if a relatively reactive material that tends to oxidize readily is used for the electrode, that material may draw oxygen ions out of the active layer during an oxidation process. This may lower the oxygen doping level of the active layer to decrease the bandgap energy 724.

Adjusting the doping of the active layer, and consequently adjusting the electron affinity 750, affects the current/voltage characteristics of the device. The doping may be controlled during a process to achieve the desired results in the current/voltage curve. For example, increasing the doping level of the active layer may decrease the leakage current in the device and increase the selectivity of the device. The doping of the active layer 608 may be characterized by the dielectric constant. As the amount of oxygen in the active layer is reduced, the dielectric constant of the active layer may increase. Therefore, the doping of the active layer may be controlled to generate a relatively high dielectric constant by reducing the oxygen level.

For example, some embodiments may dope the active layer such that a dielectric constant of the active layer is at least approximately 50-55. Some embodiments may be doped such that a dielectric constant of the active layer is at least approximately 55-60. Some embodiments may be doped such that a dielectric constant of the active layer is at least approximately 60-65. Some embodiments may be doped such that a dielectric constant of the active layer is at least approximately 65-70. Some embodiments may be doped such that a dielectric constant of the active layer is at least approximately 70-75. Some embodiments may be doped such that the dielectric constant of the active layer is approximately 30-60. For example, a specific embodiment may advantageously use a dielectric constant of approximately 40. Some embodiments may be doped such that the electron affinity of the active layer is approximately 3.6 eV. Other embodiments may be doped such that the electron affinity of the active layer is approximately 2.5 eV-3.0 eV, approximately 3.0 eV-3.5 eV, approximately 3.5 eV-4.0 eV, approximately 4.0 eV-4.5 eV, approximately 4.5 eV-5.0 eV, and/or the like. Some embodiments may be doped such that the electron affinity is greater than 3.6 eV. Some embodiments may be doped such that a dielectric constant of the active layer is greater than approximately 75. In some embodiments, the doping of the active layer may be decreased until a minimum target dielectric constant is achieved. This allows different materials or different crystal lattice types (e.g., trigonal, rhombohedral, hexagonal, etc.) to be used with different dielectric constants. Other embodiments may be doped such that a minimum difference between the energy band of the active layer and the vacuum energy layer is achieved. The $TiO_2$ may be doped with materials such as Co, C, Cr, Mo, W, C, N, Nb, Ta, Zr, Hf, S, Se, P, and/or the like, to tune the bandgap energy, electron affinity, and valence and conduction band alignment with the adjacent layers.

In addition to controlling the ratio between the thickness of the tunneling layer (e.g., the low-bandgap, high-affinity material such as amorphous silicon) and the barrier layer, and in addition to controlling the electron affinity of the active layer, an additional feature of the device may be adjusted to tune the overall current/voltage characteristics. In some embodiments, different materials for the top electrode and the bottom electrode may be used such that there is a work function differential between the two materials. The work function differential between the two electrodes may generate an internal field inversely proportional to the thickness of the dielectric layer therebetween. This work function differential may be used in some embodiments to stabilize the retention state of the memory element or to destroy the memory state of the memory element and create a selector semiconductor device. Moreover, this work function differential and internal bias field generation may cause changes in the band diagram that reduce the power required to operate the device and further reduce the leakage current.

Figure 8A:
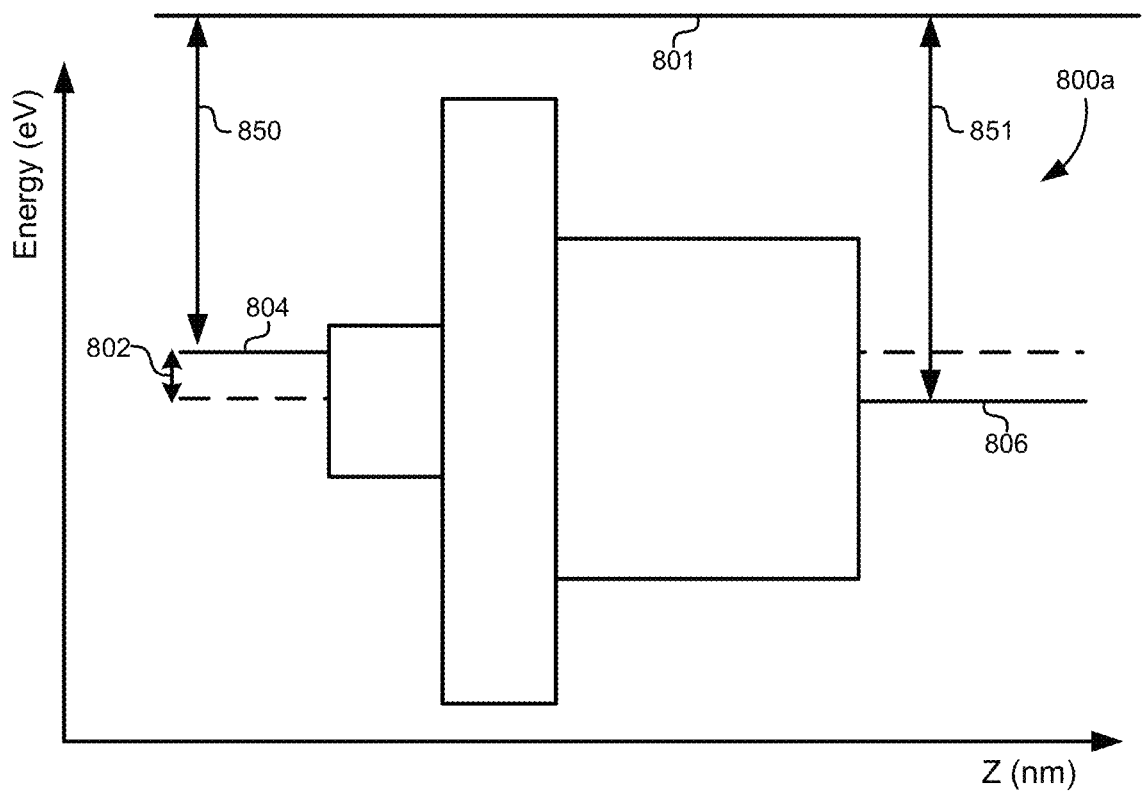
FIG. 8A illustrates a band diagram of a device using different materials for the top electrode and the bottom electrode such that there is a work function differential between the two electrodes, according to some embodiments.

FIG. 8A illustrates a band diagram 800a of a device using different materials for the top electrode and the bottom electrode such that there is a work function differential between the two electrodes, according to some embodiments. The work function of a metal electrode is similar to the electron affinity for the active region and other layers in the device. In other words, the work function of the middle electrode is the amount of energy required for an electron to break free of the material and jump to the vacuum energy level 801. In this example, the top electrode 806 has a work function 851 that may represent a baseline work function in the examples described above.

For example, the top electrode may be constructed by depositing a layer of platinum. Instead of using a layer of platinum for the bottom electrode, the bottom electrode 804 may be constructed using a different material having a different work function. In this example, the top electrode 804 may be constructed by depositing a layer of titanium nitrite, which has a work function 850 that is less than the work function 851 of the top electrode made of platinum. This creates a differential between the two work functions that may be balanced by shifting the energy bands of the other layers in the band diagram 800. For example, if the work function of the bottom electrode 804 is 4.6 eV, and the work function of the top electrode 806 is 5.6 eV, and the length of the amorphous silicon layer, the barrier layer (e.g., silicon dioxide), and the titanium oxide layer are approximately 10 nm, the work function differential will generate an electric field of 1.0 MV/cm across the device. Generally, the first electrode may have a first work function of approximately 4.5 eV to approximately 4.7 eV, and the second electrode may have a second work function that is approximately 5.0 eV higher than the first work function.

Figure 8B:
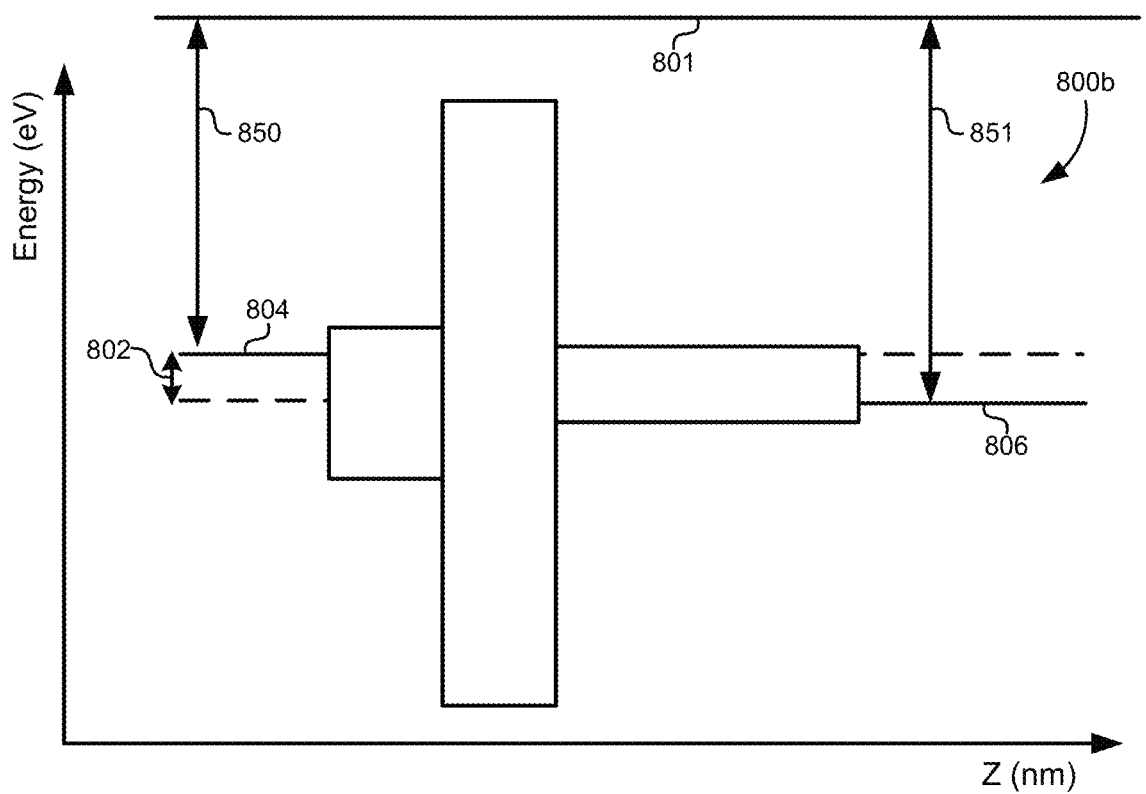
FIG. 8B illustrates a band diagram of a device with a work function differential between the two electrodes with a doped active layer, according to some embodiments.

FIG. 8B illustrates a band diagram 800b of a device using different materials for the top electrode and the bottom electrode such that there is a work function differential between the two electrodes, according to some embodiments. A combination of the work function differential and the increased affinity of the active layer through doping may be used in some embodiments to create a low-power self-rectifying memory cell. This example uses the lowered bandgap energy in the active layer as described above for FIG. 7B. The work function differential described above in FIG. 8A may also be applied to the doped active layer as illustrated in FIG. 8B to achieve similar results.

Figure 9:
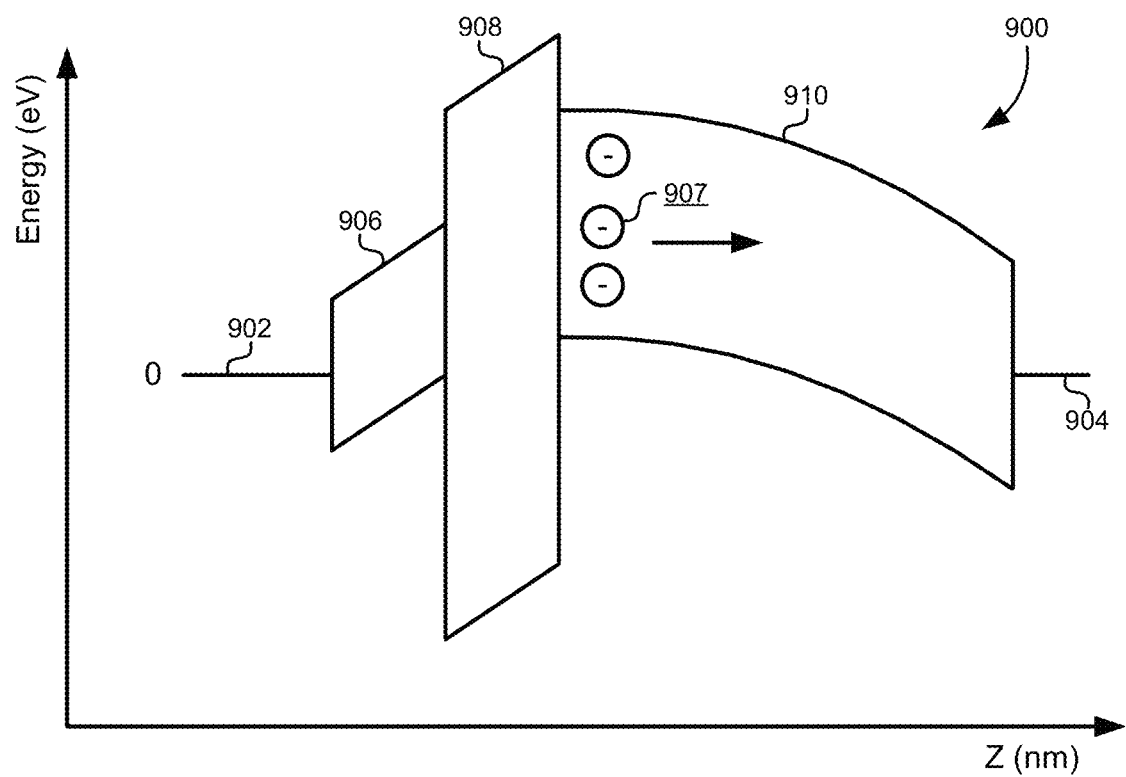
FIG. 9 illustrates a band diagram with a generated internal electric field/bias that balances a work function differential between electrodes, according to some embodiments.

FIG. 9 illustrates a band diagram 900 with a generated internal electric field/bias that balances a work function differential between electrodes, according to some embodiments. Because the natural state of the device will tend to pull the potential of both electrodes to the same level (e.g., 0 V), the rest of the band diagram will tend to bend to create this equilibrium. As illustrated in FIG. 9, the energy band 906 for the amorphous silicon layer may bend upwards to increase along its length. The energy band 908 for the barrier layer may also bend upwards to increase along its length, while the energy band 910 for the titanium oxide may bend downwards to decrease along its length and create the equilibrium between the energy level 902 of the bottom electrode and the energy level 904 of the top electrode.

There are a number of consequences for this shift in the energy bands 906, 908, 910 to balance the different work functions. First, this induces an electric field across the device 900 in order to maintain 0 V at both electrodes 902, 904. This induced electric field can require additional voltage to be applied to the device before it begins to conduct. The applied voltage may need to first overcome the induced electric field before conduction begins. Thus, at the low voltage levels typically seen in neural networks, the device will not begin to conduct the relatively high levels of leakage current illustrated in FIG. 5 until, for example, more than 1 V is applied across the device. This shifts the voltage levels were leakage currents occur to be above the voltage levels that are incidentally seen in a neural network when selecting nearby devices. This dramatically reduces the leakage current experienced in neural networks.

In addition to inducing an electric field, the work function differential between the energy level 902 of the bottom electrode and the energy level 904 of the top electrode may also cause the ions 906 in the active layer to move to the left. The magnitude of the leakage current is at least partially dependent on the position of the ions 907. The induced electric field creates an internal bias in the device 900 that delays the movement of the ions 907 to the right towards the top electrode. This delay keeps the leakage current low until a higher voltage is applied. In some embodiments, a work function difference of at least 0.6 eV may be used between the top and bottom electrodes. In other embodiments, the work function difference may be approximately 0.2 eV-0.5 eV, approximately 0.3 eV-0.6 eV, approximately 0.4 eV-0.7 eV, approximately 0.5 eV-0.8 eV, approximately 0.6 eV-0.9 eV, approximately 0.7 eV-1.0 eV, approximately 0.8 eV-1.1 eV, approximately 0.9 eV-1.2 eV, approximately 1.0 eV-1.3 eV, and/or greater than approximately 1.2 eV.

Figure 10:
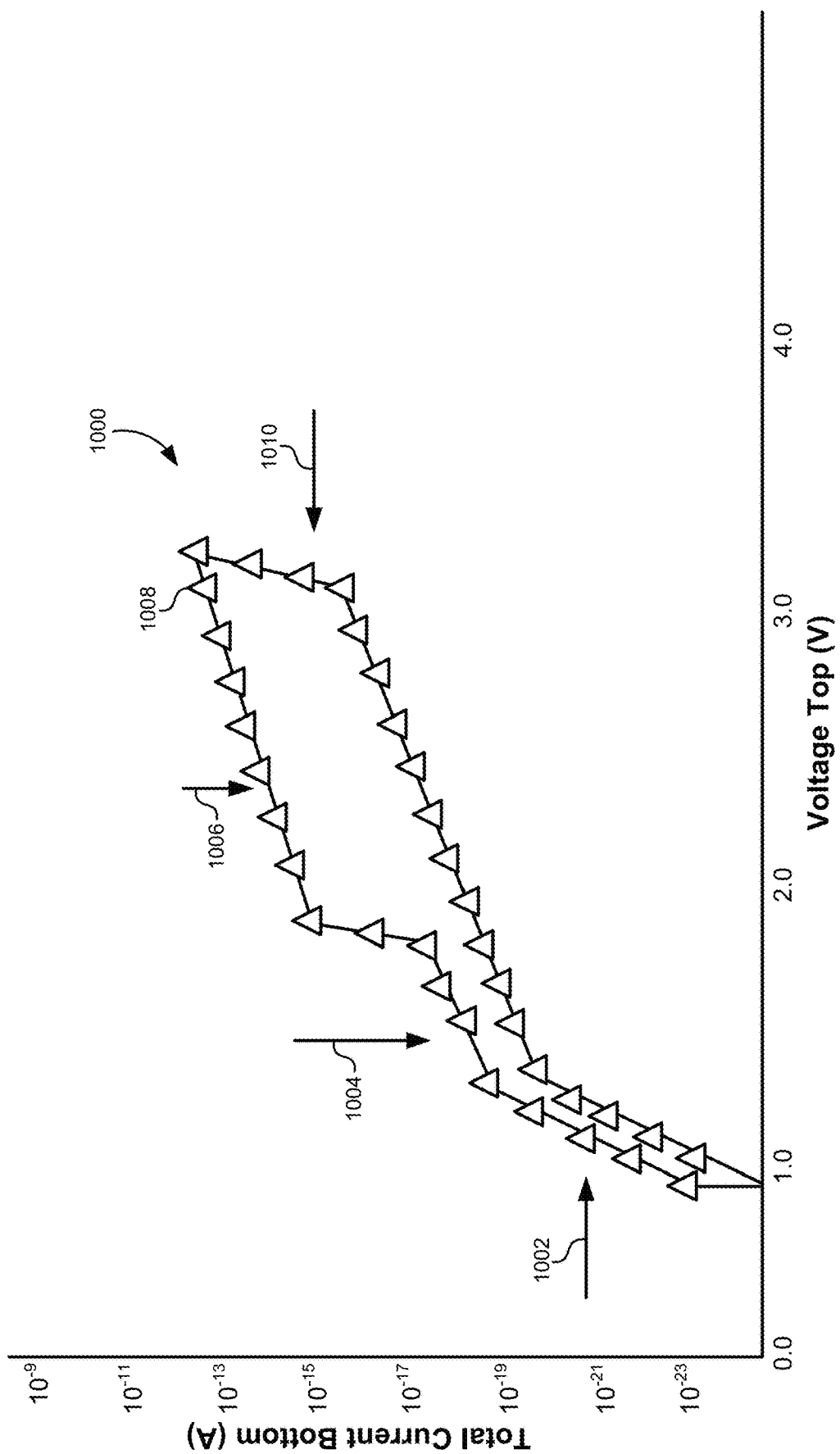
FIG. 10 illustrates a graph of the current/voltage response of the device as it is tuned to be more power efficient, according to some embodiments.

FIG. 10 illustrates a graph 1000 of the current/voltage response of the device as it is tuned to be more power efficient, according to some embodiments. The three improvements introduced above may each cumulatively affect the power efficiency of the device and a network. As described above, the work function differential shifts the entire curve to the right (1002), which nearly eliminates leakage currents at lower voltages that may be caused when neighboring devices in a network are activated. The work function differential between the top electrode and the bottom electrode may also compress the curve from the right (1010). This compression reduces the voltage required to fully turn on the device. Devices without the optimizations described herein would operate fully at 4 V, while optimizing the structure of the device may reduce the operating voltage to 2-3 V. By adjusting the thickness of the barrier layer (e.g., silicon dioxide), the total magnitude of the leakage current in the curve may also be reduced (1006). Additionally, changing the doping of the active layer may cause the selectivity of the device to increase (1004). Each of these three optimization techniques may be used alone and/or in combination to achieve the desired results. The circuit designer may adjust the doping of the active layer, the thickness of the barrier layer, and/or the materials used for the top/bottom electrode to generate the current/voltage curve illustrated in FIG. 10. For example, a 1:1 ratio between the thickness of the amorphous silicon and the silicon dioxide (e.g., 1.5 nm and 1.5 nm) may be used with platinum and titanium nitride to generate approximately a 0.6 eV work function difference between the top electrode (e.g., 5.1 eV) and the bottom electrode (e.g., 4.5 eV).

Figure 11:
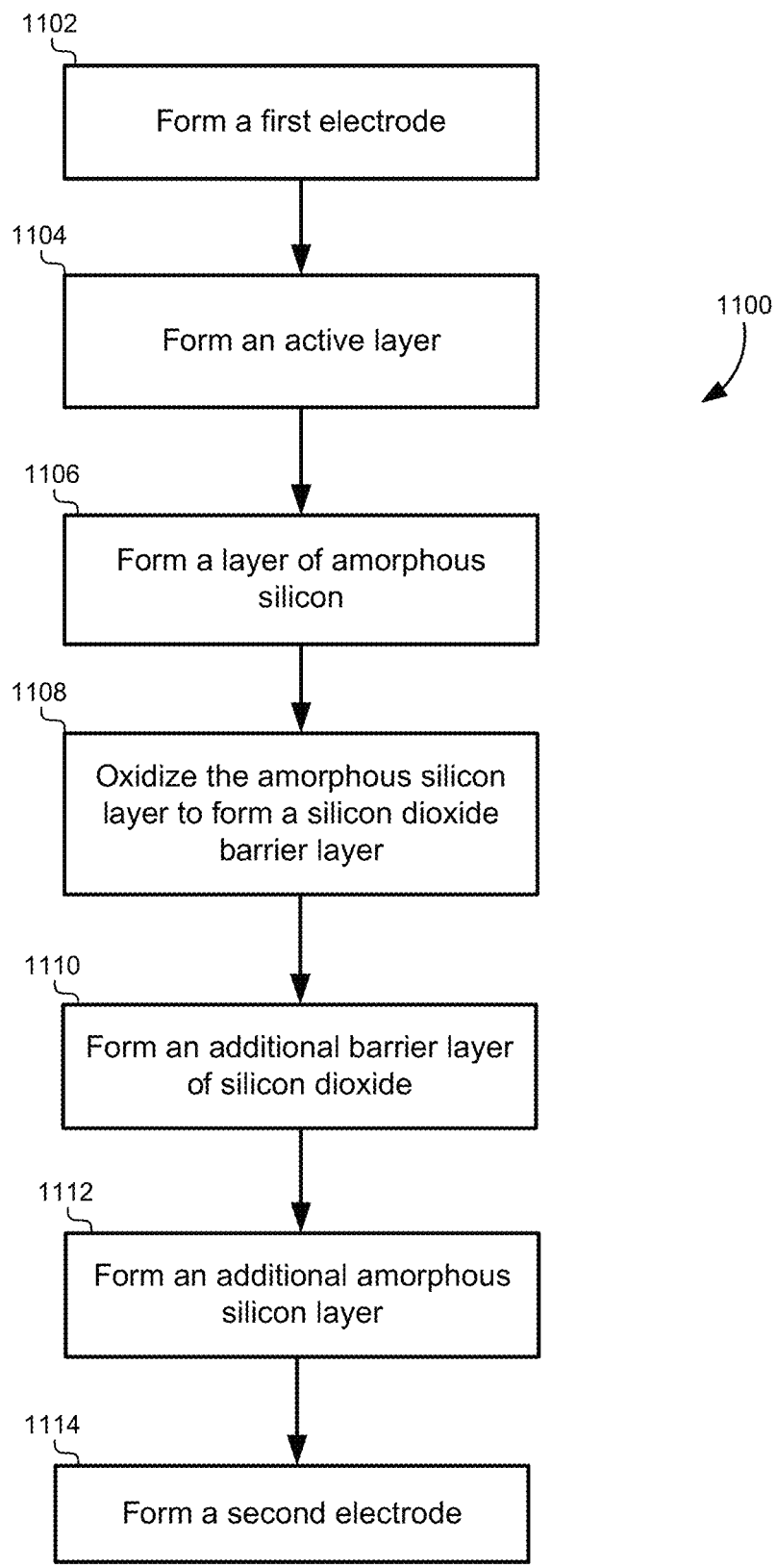
FIG. 11 illustrates a flowchart of a method for fabricating a combined memory and selector device, according to some embodiments.

FIG. 11 illustrates a flowchart 1100 of a method for fabricating a combined memory and selector device, according to some embodiments. Note that the steps for fabricating this device can also be reversed, starting with the second electrode and working back to the first electrode as described below. The method may include forming a first electrode (1502). The first electrode may have a work function that is relatively low compared to a work function of a top electrode that will be formed later. The first electrode may have a work function of between approximately 4.4 eV and 5.3 eV. For example, the work function of the first electrode may be between approximately 4.4-4.5 eV, approximately 4.5-4.6 eV, approximately 4.6-4.7 eV, approximately 4.7-4.8 eV, approximately 4.8-4.9 eV, approximately 4.9-5.0 eV, approximately 5.0-5.1 eV, approximately 5.1-5.2 eV, approximately 5.2-5.3 eV, approximately 4.4-4.6 eV, approximately 4.5-4.7 eV, approximately 4.6-4.8 eV, approximately 4.7-4.9 eV, approximately 4.8-5.0 eV, approximately 4.9-5.1 eV, approximately 5.0-5.2 eV, approximately 5.1-5.3 eV, approximately 4.4-4.7 eV, approximately 4.5-4.8 eV, approximately 4.6-4.9 eV, approximately 4.7-5.0 eV, approximately 4.8-5.1 eV, approximately 4.9-5.2 eV, approximately 5.0-5.3 eV, and/or any combination of these approximate ranges. Increasing the work function of the first electrode may increase the on-state conductivity of the device. The first electrode may be deposited using a layer of titanium, and/or any other conductive material, such as Pt, TiN, TaN, Ir, Ru, Pd, Ta, W, IrOx, RuOx, TiAlN, Co, high doped Si (p-type), and/or the like.

The method may also include forming an active layer (1104). The active layer may be formed on top of the first electrode metal, and may be formed using any known process for forming an active layer. The active layer may be formed out of titanium oxide, and may be formed using deposition processes, such as atomic layer deposition (ALD), chemical vapor deposition (CVD), and/or the like. The active layer may be a scavenged active layer that reacts with the metal of the bottom electrode to remove oxygen from the active layer. The active layer may be formed to have any of the characteristics described above in this disclosure. For example, the active layer may have its doping controlled to produce at least a minimum dielectric constant. Doping may be controlled by controlling the power with which titanium and/or oxygen are added to a deposition vapor. Alternatively, instead of directly scavenging the active layer, some embodiments may use ion bombardment or a very thin scavenger layer on the titanium oxide or any other transitional metal oxide with high electron affinity.

The method may additionally include forming a layer of amorphous silicon (1106). The amorphous silicon layer may be generated by growing a chemical layer of an oxide. For example, an approximately 0.5 nm layer of amorphous silicon may be deposited, which completely oxidizes into silicon dioxide when it comes in contact with the titanium oxide of the active layer (1108). In some embodiments, an additional chemical layer of silicon dioxide may then be deposited to form the barrier layer (1110). For example, a layer of silicon dioxide approximately 1 nm may be formed on top of the existing silicon dioxide formed by the oxidation process to form a total barrier width of approximately 1.5 nm. Next, an additional amorphous silicon layer may be added (1112) having any of the characteristics described above. A second electrode or top electrode may then be added having a higher work function than the first or bottom electrode (1114) as described above.

Figure 12A:
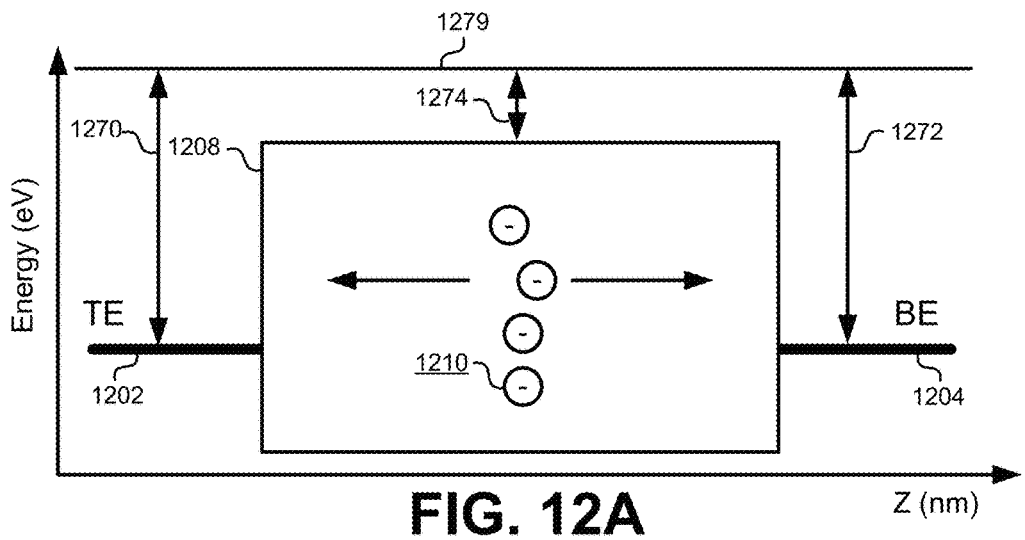
FIG. 12A illustrates a band diagram of a basic nonvolatile memory device comprising an active region, a top electrode, and a bottom electrode.
Figure 12B:
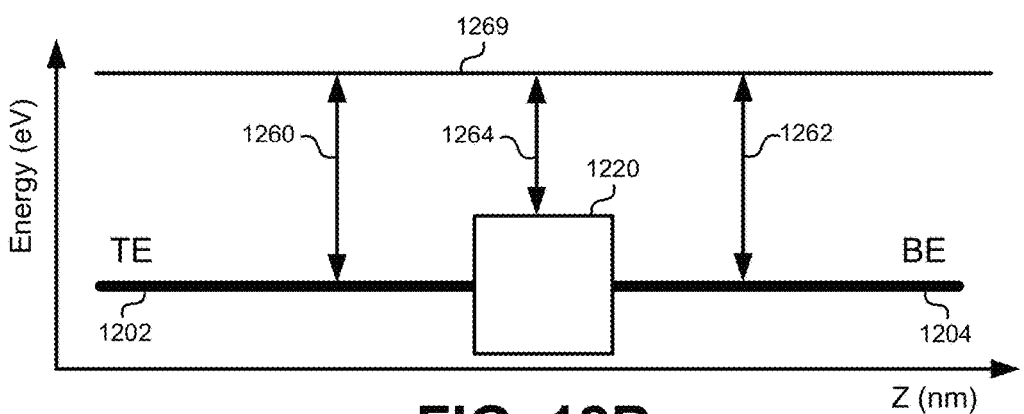
FIG. 12B illustrates a dielectric tunneling device with high electron affinity, according to some embodiments.
Figure 12C:
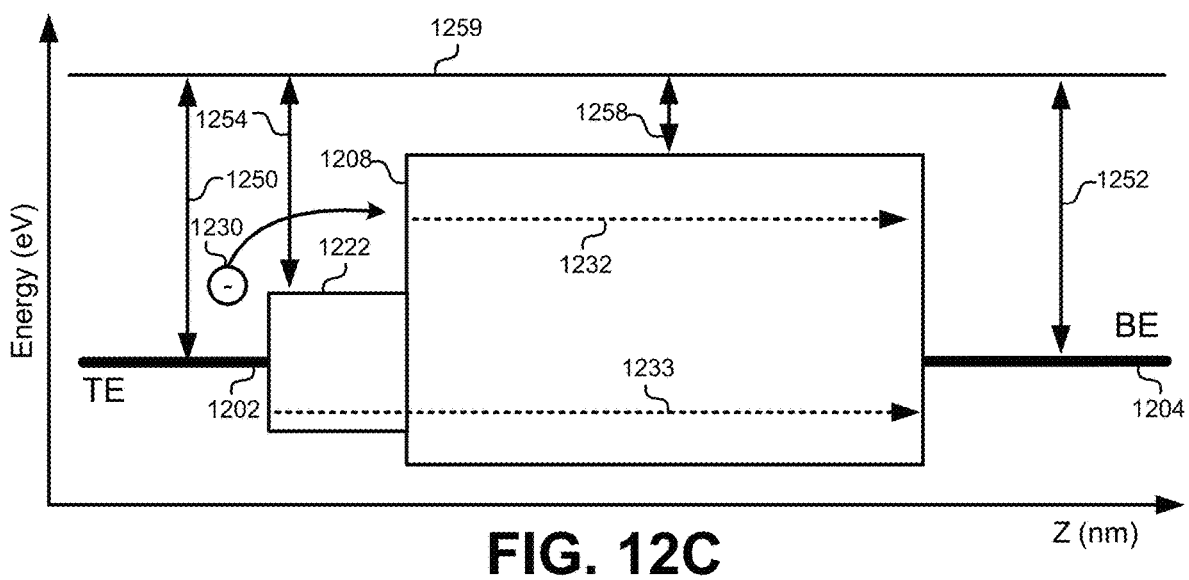
FIG. 12C illustrates a combination of an active layer and a high-affinity, relatively low-k tunneling layer, to form a crested-barrier device, according to some embodiments.

FIG. 12A illustrates a band diagram of a basic nonvolatile memory device comprising an active region 1208, a top electrode 1202, and a bottom electrode 1204. The active region 12085 may be fabricated using titanium oxide (TiOx) or other similar materials. As described above, moving ions modulate the conduction and valence band offsets and dielectric transparency (i.e., the tunneling probability) as a way to store a state in the active layer 1208. When a voltage is applied across the device, a ions (or any other mobile species) move or drift from one location in the active region to another location. The position of the ions (or any other mobile species) may be precisely determined by an external voltage to a desired position within the active layer for precisely tuning the conductance. In turn the level of conductance in the device may be used to store one or more logic levels as a memory. FIG. 12B illustrates a dielectric tunneling device with high electron affinity (e.g., higher than 4 eV), according to some embodiments. This layer may have an affinity that is higher than the active layer with a lower dielectric constant. The dielectric device includes a tunneling layer 1220 comprising a low bandgap material with a high electron affinity and relatively low dielectric constant. Some embodiments may use a material such as cobalt oxide ($Co_3O_3$) or any other similar material having a small bandgap. FIG. 12C illustrates a combination of an active layer 1208 and a high-affinity, relatively low-k tunneling layer 1222, to form a crested-barrier device, according to some embodiments. By way of example, the active layer 1208 may be formed using titanium oxide (TiOx), and the tunneling layer 1222 may be formed using a material such as cobalt oxide ($Co_3O_3$). Other similar materials having similar properties may be used without limitation. This device includes a tunneling self-rectifying layer 1222 between the top electrode 1202 and the active layer 1208. The device need not include a second tunneling layer between the bottom electrode 1204 and the active layer 1208, although such a device is described in the commonly-assigned U.S. patent application Ser. No. 16/857,589 filed on Apr. 24, 2020, which is incorporated herein by reference. Note that the energy band of tunneling layer 1222 is substantially less than the energy band of the active layer 1208. In comparison to other devices, the tunneling layer 1222 provides an energy band that is significantly less than the energy band of the active layer 1208. The difference between these two energy bands forms a tunneling barrier that keeps electrons from tunneling between the top electrode 1202 and the bottom electrode 1204 without a sufficient voltage being applied. Some embodiments may also include additional high-affinity layers (i.e., having a higher affinity than active layer) between the tunneling layer 1222 and the active layer 1208. The bandgap energy of this additional layer may fall between the bandgap energy of the tunneling layer 1222 and the active layer 1208.

For example, as an electron 1230 enters the conduction band of the tunneling self-rectifying layer 1222, it will be stopped by the relatively large energy band and thickness of the active layer 1208. This energy band forms a barrier over which the electron 1230 must proceed in order to get to the bottom electrode 1204. The energy band of the active layer 1208 may be overcome by applying a voltage sufficient to increase the energy of the electron 1230 over the energy band of the active layer 1208. Tunneling through the barrier of the active layer 1208 is unlikely given: (1) the magnitude of the energy band of the active layer 1208 compared to the energy of the electron 1230 in the self-rectifying tunneling layer 1222; and (2) the band banding due to the low-k value and higher-voltage drop on this part of the voltage divider formed by tunneling layer and active layer. The potential drop over the tunneling self-rectifying layer is much higher compared to previous devices using specific layers comprising aSi/Barrier/TiO2 such that tunneling and electron conduction will occur through the valence band of these devices. Essentially, this difference between the energy band levels of the tunneling layer 1222 and the active layer 1208 acts as a barrier to replace the large barrier found in previous devices, which absorbs a large portion of the applied voltage, and increases the operation condition of the cell. Furthermore, the dielectric constant of the tunneling layer 1222 may be significantly lower than the dielectric constant of the active layer 1208 as described below. The difference between the conduction band offsets may be at least 0.7 eV (the electron affinity of the tunneling self-rectifying layer may be higher), while the valence band offset may be relatively small or even negative (where negative implies that the valence band of tunneling layer is under the valence band of active layer). For example, holes may see a barrier when tunneling from the active layer to the tunneling oxide. Thus, the valence band of tunneling layer may be energetically lower compared to valence band of active region.

Examining the energy bands of FIG. 12C reveals a number of distinct advantages provided by this device. First, in the absence of an applied voltage, the tunneling distance 1233 for an electron at the top electrode 1202 and/or the bottom electrode 1204 corresponds to the width of the tunneling layer 1222 and the active layer 1208. There are no areas where the energy bands skew up or down to leave small tunneling distances available to the electron. Second, by relying on the difference between the energy bands of the tunneling self-rectifying layer 1222 and the energy band of the active layer 1208 to form a barrier, the operating voltage may be reduced. For example, the operating voltage required for an electron to move over the energy band of the active layer 1208 may be considerably less than the device in FIG. 5A, such as approximately 2 V-2.5 V rather than approximately 4 V-5 V. This reduces the power required to operate this device in FIG. 12C by as much as 50%. This reduction in power is particularly important given the exponential growth of data storage and low voltage requirements of many advanced I/O devices. Currently, approximately 7% of our available energy supply goes to powering data storage centers used by social media, search engines, and other online data storage services. Reducing the operating voltage by 50% may dramatically reduce the overall power requirements of data storage centers around the world.

One way to characterize the device in FIG. 12C is by the relative dielectric constants of each of the different layers. In some embodiments, the dielectric constant of the active layer 1208 may be a multiple of the dielectric constant of the tunneling layer 1222. For example, using the cobalt oxide and titanium oxide device of FIG. 12C, the dielectric constant of the tunneling layer 1222 may typically range between approximately 10 and approximately 17. In comparison, the dielectric constant of the active layer 1208 may range between approximately 30 and approximately 60. Thus, the dielectric constant of the active layer 1208 may be at least approximately 1.5 or 1.7 times as large as the dielectric constant of the tunneling layer 1222. In some embodiments, the dielectric constant of the active layer 1208 may be any value between approximately 1.5 and 2.0 times greater, approximately 2.0 and 2.5 times greater, approximately 2.5 and 3.0 times greater, approximately 3.0 and 4.0 times greater, approximately 4.0 and 5.0 times greater, approximately 5.0 and 6.0 times greater, approximately 6.0 and 7.0 times greater, approximately 7.0 and 8.0 times greater, approximately 8.0 and 9.0 times greater, approximately 9.0 and 10.0 times greater, and/or more than a proximally 10 times greater. Each of these ranges provides specific benefits to the electrical characteristics of the device. Additionally, together with the dielectric constant and the band offset tuning through doping, the thickness ratio of tunneling and active layer can also be tuned to achieve a desired ON/OFF ratio and operation condition for the device.

In addition to characterizing the active layer 1208 in comparison to the tunneling layer 1222 by differences in the dielectric constants, some embodiments may also characterize the active layer 1208 by comparing the relative electron affinity between the active layer 1208 and the tunneling layer 1222. For example, for an active layer of TiOx, the electron affinity will be approximately 3.4 eV to 4.0 eV. In comparison, the $Co_3O_4$ used in the tunneling layer 1222 may have an electron affinity of approximately 4.8 eV-5.5 eV. Generally, the electron affinity of the tunneling layer 1222 may be higher than the electron affinity of the active layer. In some embodiments, the electron affinity of the tunneling layer 1222 may be greater than 4.8 eV, while the electron affinity of the active layer 1208 may be less than approximately 4.0 eV. Some embodiments may also tune the electron affinity and alignment of the various energy bands by doping the active layer TiOx with other materials, such as Co, C, Cr, Mo, W, C, N, Nb, Ta, Zr, Hf, S, Se, P, and/or the like. Some embodiments may use chromium oxide, cerium oxide, any other multi-oxidation state oxide, and/or combinations of TaOx/HfO2 instead of TiOx as an active layer material.

In another embodiment, the tunneling layer 1222 may be replaced with amorphous silicon, TiOxNy, MnO3 or CrO3 or V2O5, WO3, NiO, Cr2O3, SnS2, or any other high-affinity, small-bandgap oxide, rather than cobalt oxide. Moreover, by alloying using different materials new tunneling barriers can be engineered. In these embodiments, the dielectric constant of the tunneling layer 1222 may be lowered to approximately 4. As described above, the dielectric constant of the active layer 1208 using titanium oxide is approximately 30 to approximately 60. In this embodiment, the dielectric constant of the active layer 1208 may be between approximately 7 times greater and 15 times greater than the dielectric constant of the tunneling layer 1222.

In another embodiment, titanium oxide may be used as the tunneling layer 1222. However, a different form of crystal lattice for the titanium oxide may be used such that the dielectric constant of the tunneling layer 1222 is approximately 25. The crystal lattice of the titanium oxide can come in various forms depending on its phase and how it is grown. Depending on the crystal lattice and the phase, the dielectric constant of different forms of titanium oxide can range from 12-100. In this embodiment, the titanium oxide has a much lower dielectric constant and does not act as an active layer. Instead, doped hafnium oxide may be used as the material for the active layer 1208, which has a dielectric constant of approximately 40. In these embodiments the dielectric constant of the active layer 1208 may be between approximately 1.5 and approximately 2.5 times greater than the dielectric constant of the tunneling layer which in turn can reduce the operating voltage even more.

In some embodiments, TiOx may be used as an active layer, and alloying different materials may be used to create a tunneling layer. Alloying may include the direct chemical combination of different oxides. The combination of a few high-affinity oxides may be used to create a tunneling layer while maintaining the shape illustrated in FIG. 12C.

Although FIG. 12C illustrates the tunneling layer 1222 to be directly adjacent to the active layer 1208, this is provided only by way of example and is not meant to be limiting. In other embodiments, additional layers may be present between the tunneling layer 1222 and the active layer 1208.

In some embodiments, different materials for the top electrode and the bottom electrode may be used such that there is a work function differential between the two electrodes. The work function of a metal electrode is similar to, or higher than the electron affinity for the tunneling layer and other layers in the device. In other words, the work function of the metal electrode corresponds to the amount of energy required for an electron to break free of the material and ionize to the vacuum energy level.

For example, the top electrode 1202 may be constructed by depositing a layer of platinum. Instead of using a layer of platinum for the bottom electrode 1204, the bottom electrode 1204 may be formed using a different material having a different work function. In this example, the bottom electrode 1204 may be constructed by depositing a layer of titanium nitrite, which has a work function that is less than the work function of the top electrode 1202 made of platinum. This creates a differential between the two work functions that may be balanced by shifting the energy bands of the other layers in the band diagram 800. For example, if the work function of the bottom electrode 1204 is 4.6 eV, and the work function of the top electrode 1206 is 5.6 eV, and the length of the tunneling layer 1222 and the active layer 1208 are approximately 10 nm, this work function differential will generate an electric field of 1.0 MV/cm across the device. Because the natural state of the device will tend to pull the potential of both electrodes to the same level (e.g., 0 V), the rest of the band diagram may tend to bend to create this equilibrium. This workfunction differential may be used for tuning the position of the lobe described in a voltage/current curve to accommodate any design rules. This may also be used to tune the read-voltage and ON/OFF ratio of the device and to tune the self-rectification (and leakage) of the device.

Creating a work function differential between the top electrode 1202 and the bottom electrode 1204 affects the operation of the device in a number of ways. First, this induces an electric field across the device in order to maintain 0 V at both electrodes 1202, 1204. This induced electric field can require additional voltage to be applied to the device before it begins to conduct. The applied voltage may need to first overcome the induced electric field before conduction begins. Thus, at the low voltage levels typically seen in memory arrays or in neural networks, the device will not begin to conduct the relatively high levels of leakage current illustrated in FIG. 6 until, for example, more than 1 V is applied across the device. This shifts the voltage levels where leakage currents occur to be above the voltage levels that are incidentally seen in a neural network when selecting nearby devices. This dramatically reduces the leakage current experienced in neural networks and memory arrays.

In addition to inducing an electric field, the work function differential between the bottom electrode 1204 and the top electrode 1202 may also cause the ions 1210 in the active layer to move to one side of the active layer 1208. The magnitude of the leakage current is at least partially dependent on the position of the ions 1210. The induced electric field creates an internal bias in the device that delays the movement of the ions 1210 to the towards the opposing electrode. This delay keeps the leakage current low until a higher voltage is applied. In some embodiments, a work function difference of at least 0.2 eV may be used between the top and bottom electrodes. In other embodiments, the work function difference may be approximately 0.2 eV-0.5 eV, approximately 0.3 eV-0.6 eV, and so forth. Differentials greater than 0.6 eV for total thickness of layer between electrode around 10 nm may lose memory retention as the field generated may be strong enough that even at 0 V applied, the ions may be pushed completely to the other side of the device. Such devices with the retention characteristics deliberately destroyed may be used as tunneling selection devices.

Figure 13:
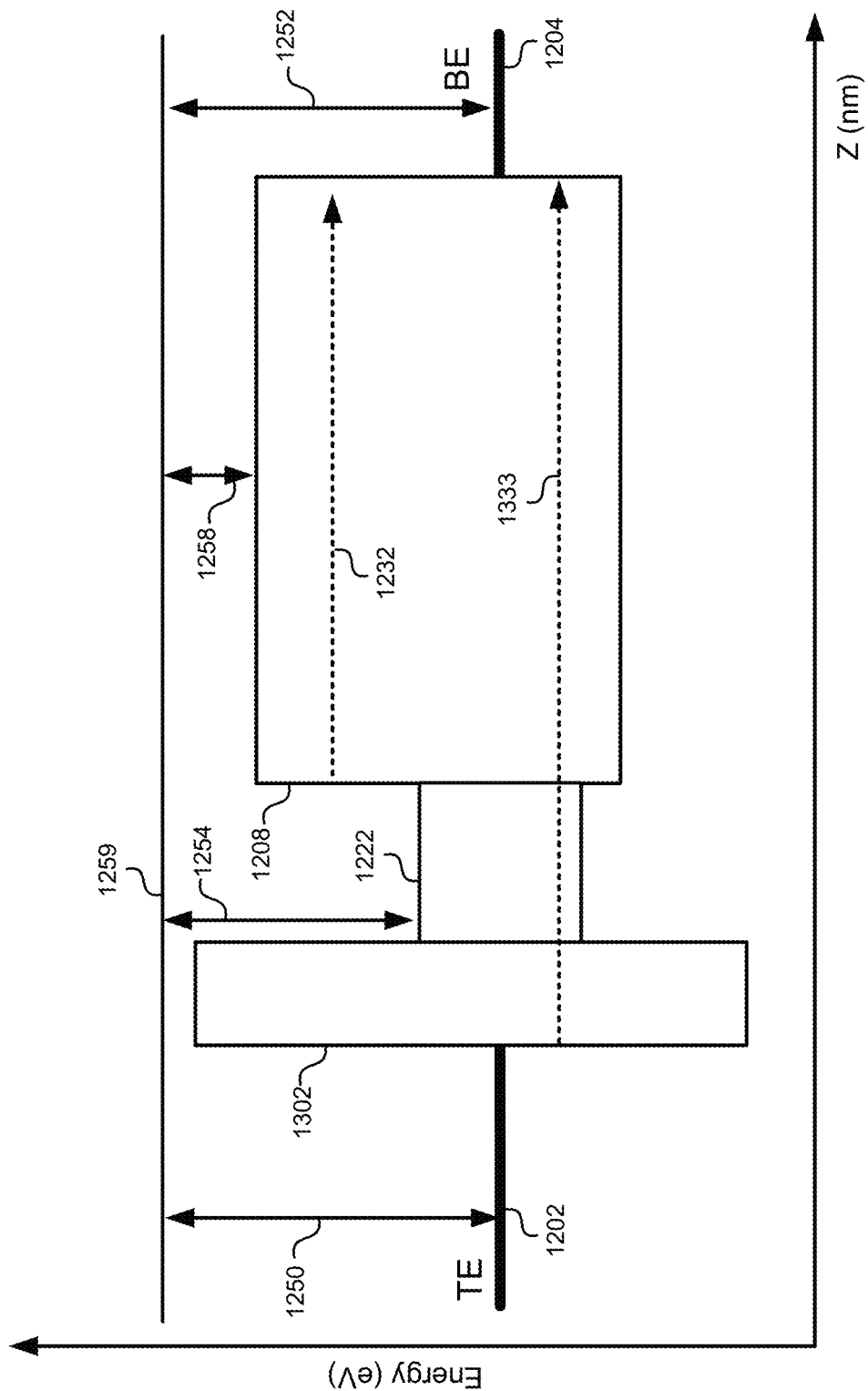
FIG. 13 illustrates a device with a barrier layer, according to some embodiments.

FIG. 13 illustrates a device with an added barrier layer, according to some embodiments. These embodiments may add the outer barrier layer to the device that is described in the commonly-assigned U.S. patent application Ser. No. 16/857,589 filed on Apr. 24, 2020, which is incorporated herein by reference. A barrier layer 1302 may be added between the top electrode 1202 and the tunneling layer 1222. The effect of adding the outer, relatively thin barrier layer 1302 can be best described with reference to FIG. 6. Adding the barrier layer 1302 compresses the size of the lobes in the horizontal (voltage) direction. This reduces the voltage required to operate the device while increasing the on-off ratio. Note that in some embodiments, this can increase the leakage current at very low voltages, and thus increases the ON/OFF ratio of the crested barrier device. Therefore, it may require the addition of the an additional selector device to minimize leakage current when the device is not being directly addressed in a memory array. By way of example, the active layer 1208 may be formed using titanium oxide (TiOx), the tunneling layer 1222 may be formed using a material such as cobalt oxide ($Co_3O_3$), and the barrier layer 1302 may be formed using a material such as silicon dioxide. Other similar materials having similar properties may be used without limitation.

Various materials and configurations may be used for the barrier layer 1302. Such materials may include AlN, $HfO_x$, $ZrO_2$, $Al_2O_3$, $SiO_2$, and other similar materials. The thickness of the barrier layer 1302 may be sized relative to the other layers 1222, 1208 in the device. In some embodiments, a preferred thickness ratio between the barrier layer 1302, the tunneling layer 1222, and the active layer 1208 may be approximately 1:2:9. For example, the barrier layer 1302 may be approximately 1 nm, the tunneling layer 1222 may be approximately 2 nm, and the active layer 1208 may be approximately 9 nm. An absolute thickness of the barrier layer 1302 may range between approximately 0.5 nm and approximately 3.0 nm. Decreasing the thickness of the barrier layer 1302 below this range may eliminate the ability of the barrier layer 1302 to prevent tunneling without sufficient voltage being applied. Increasing the thickness of the barrier layer 1302 above this range may cause the on/off ratio to be reduced. Increasing the thickness of the barrier layer 1302 above this range may decrease the current through the device, but also may expand the lobe of the current-voltage curve in the voltage direction to cause the operating voltage to increase with reference to FIG. 6. This would require higher voltages in order to set/reset the device.

It is helpful to consider each of the layers 1302, 1222, 1208 as a capacitor in a capacitive-divider circuit. Increasing the thickness of any layer decreases the capacitance, which in turn increases the total voltage across the device that must be applied in order for it to operate. Thus, minimizing the thickness of the barrier layer 1302 to approximately 1.0 nm while maintaining the approximate 1:2:9 ratio described above may lead to optimal results. For example, the tunneling layer 1222 may range from approximately 1.0 nm to approximately 3.0 nm, and the active layer 1208 may range between approximately 7.0 nm and 15.0 nm. Reducing the thickness of the active layer 1208 below this range may increase the leakage current beyond a satisfactory limit.

As described above, the top/bottom electrodes 1202, 1204 for both use different metals having different work functions. Therefore, the metal materials and work functions described anywhere in this disclosure may be used with this particular embodiment in any combination and without limitation.

Figure 14:
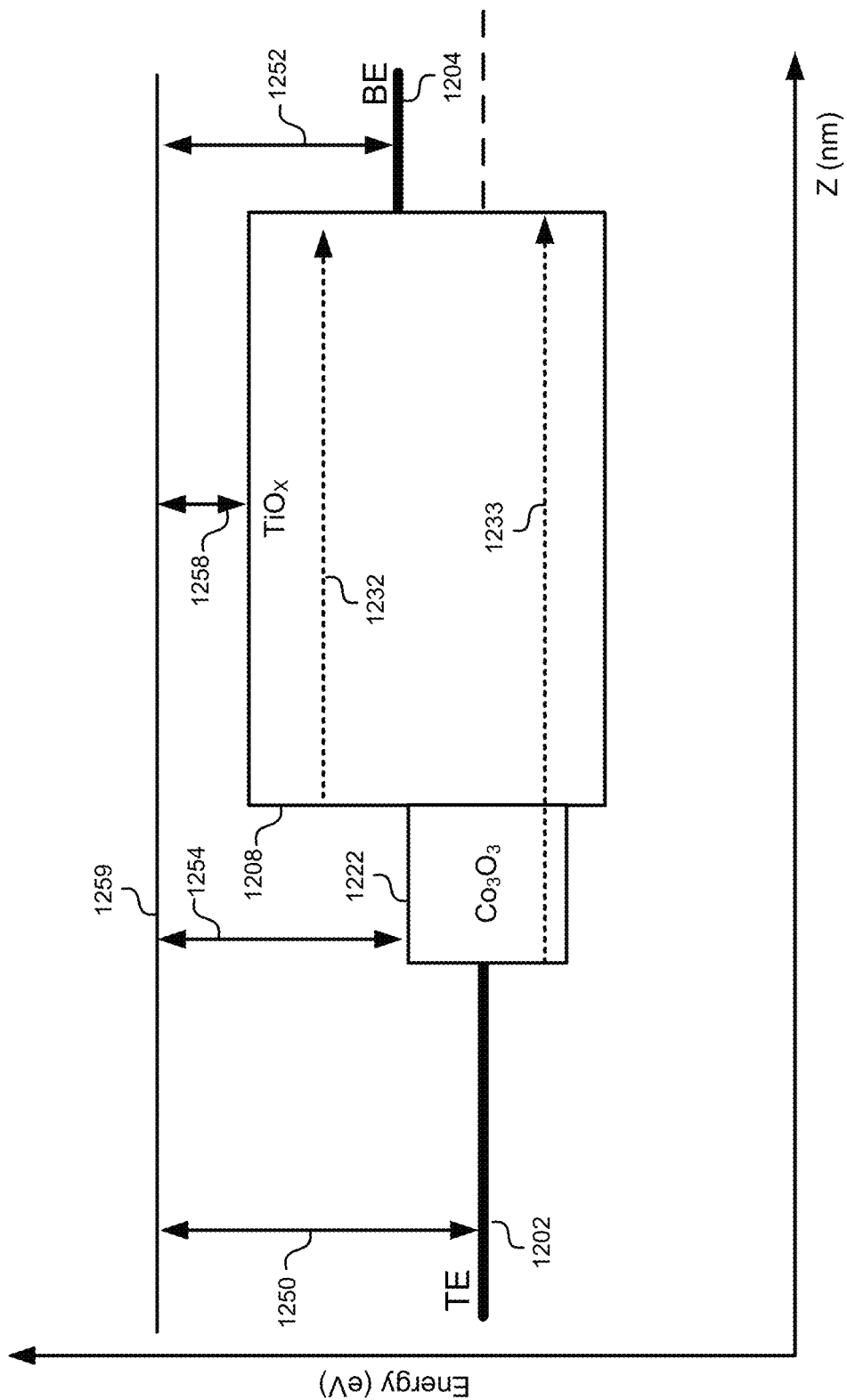
FIG. 14 illustrates a device with a highly asymmetrical work function between the top electrode and the bottom electrode, according to some embodiments.

FIG. 14 illustrates a device with a highly asymmetrical work function between the top electrode and the bottom electrode, according to some embodiments. As described above, different conductive materials may be used for the top electrode 1202 and the bottom electrode 1204. Using different materials may generate a work-function differential between the top electrode 1202 and the bottom electrode 1204. For example, if the work function of the top electrode 1202 is much greater than the work function of the bottom electrode 1204, this has the effect of pushing ions back due to an internally generated electric field. This internal field action on the internal ions destroys the retention of the device and instead creates a very effective tunneling selector. Generally, work function differentials greater than 0.6 eV between the top electrode 1202 and the bottom electrode 1204 may generate this type of behavior.

Figure 15:
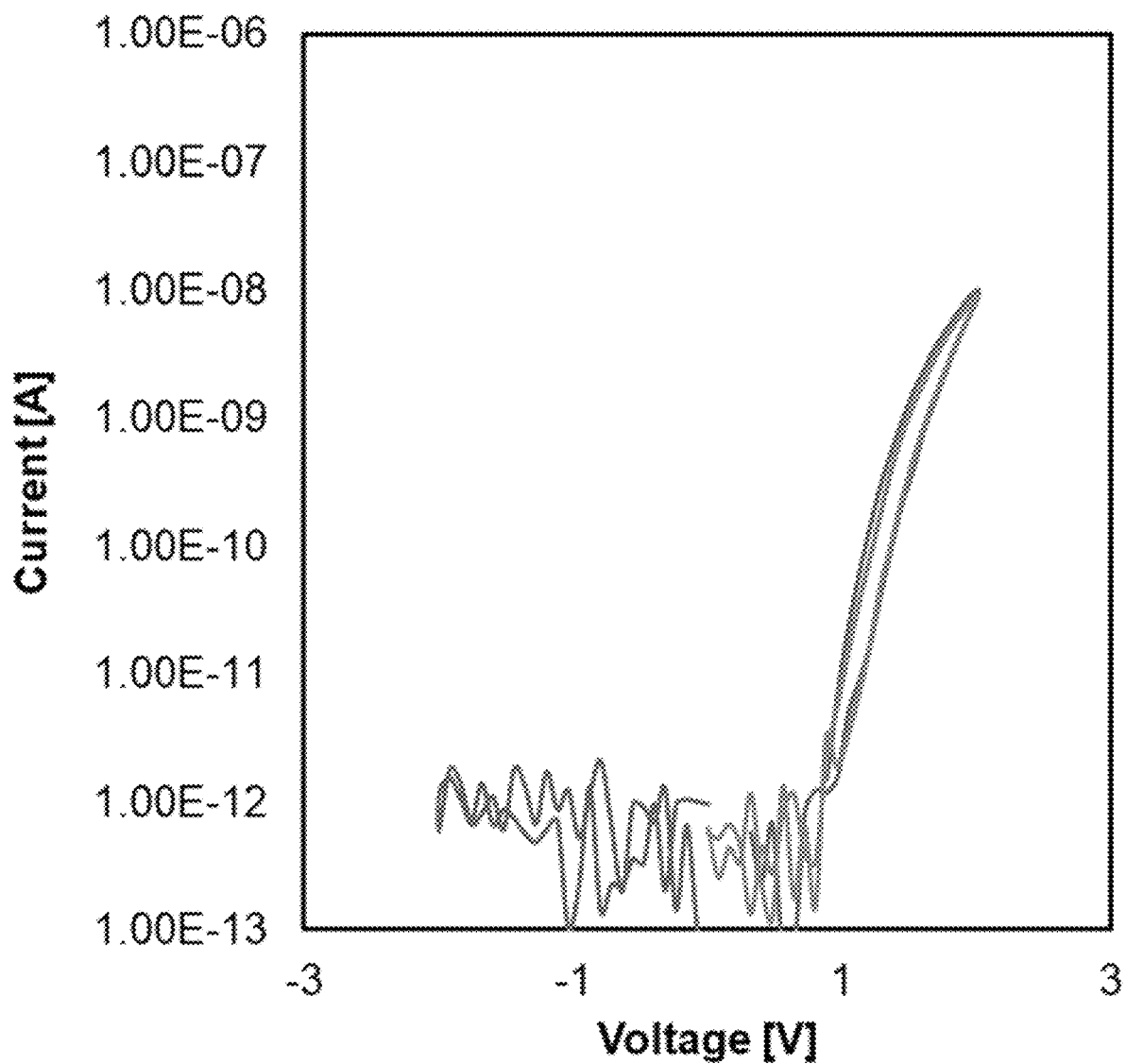
FIG. 15 illustrates a voltage-current curve for the selector device with highly asymmetrical work functions, according to some embodiments.

FIG. 15 illustrates a voltage-current curve for the selector device with highly asymmetrical work functions, according to some embodiments. As illustrated in FIG. 15, the operation of the device becomes very similar to that of a traditional diode. The forward and return paths of the voltage-current curve are nearly identical. Although this does not allow the device to store state, it does allow the device to act as a selector. This device may be paired with any memory device described herein or otherwise available. Additionally, the materials, thicknesses, geometries, and work function differentials described with regard to any of the devices in this disclosure may be applied to this device without restriction.

Figure 16:
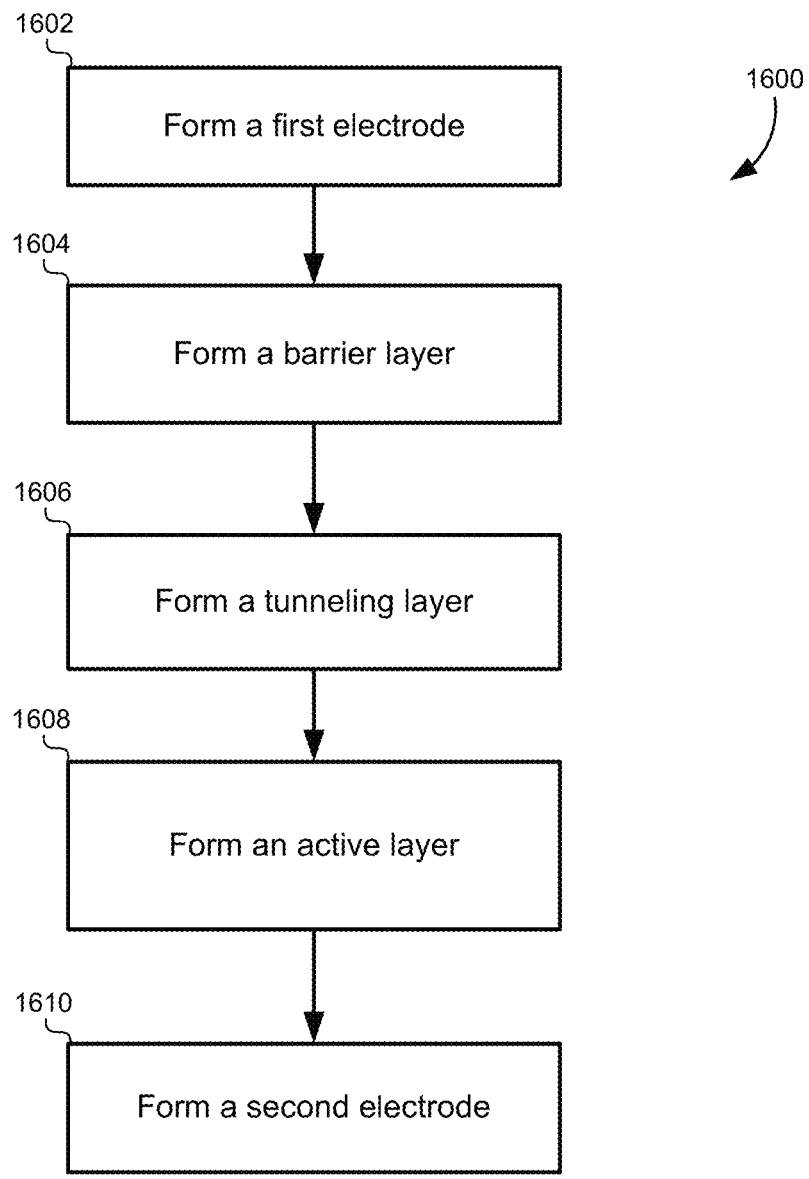
FIG. 16 illustrates a flowchart of a process for manufacturing a combined memory-selector device, according to some embodiments.

FIG. 16 illustrates a flowchart 1600 of a process for manufacturing a self-rectifying memory device, according to some embodiments. The method may include forming a first electrode (1602). The first electrode may have a work function that is relatively low compared to a work function of a top electrode that will be formed later. The first electrode may have a work function of between approximately 4.9 eV and 5.3 eV. For example, the work function of the first electrode may be between approximately 4.9-5.0 eV, approximately 5.0-5.1 eV, approximately 5.1-5.2 eV, approximately 5.2-5.3 eV, approximately 4.4-4.6 eV, approximately 4.5-4.7 eV, approximately 4.6-4.8 eV, approximately 4.7-4.9 eV, approximately 4.8-5.0 eV, approximately 4.9-5.1 eV, approximately 5.0-5.2 eV, approximately 5.1-5.3 eV, approximately 4.4-4.7 eV, approximately 4.5-4.8 eV, approximately 4.6-4.9 eV, approximately 4.7-5.0 eV, approximately 4.8-5.1 eV, approximately 4.9-5.2 eV, approximately 5.0-5.3 eV, and/or any combination of these approximate ranges. Increasing the work function of the first electrode may increase the on-state conductivity of the device. The first electrode may be deposited using a layer of platinum, and/or any other high-work-function conductive material, such as, Pd, Co, IrO, RuO, W, Ir, Ni and/or the like.

The method may also include forming a barrier layer on top of the first electrode (1604). The barrier layer may be formed directly on the first electrode, or intervening layers may also be allowed. Various materials and configurations may be used for the barrier layer, including AlN, $HfO_x$, $ZrO_2$, $Al_2O_3$, $SiO_2$, and other similar materials. The thickness of the barrier layer may be sized relative to the other layers, with a preferred thickness ratio between the barrier layer, the tunneling layer, and the active layer being approximately 1:2:9. For example, an absolute thickness of the barrier layer 1302 may range between approximately 0.5 nm and approximately 3.0 nm.

The method may also include forming a tunneling layer (1606). The tunneling layer may be formed on the barrier layer, although intervening layers are also possible. In some embodiments, no intervening layers may be included between the first electrode and the tunneling layer. The tunneling layer may be deposited as a layer of a cobalt oxide, such as $Co_3O_4$. Some embodiments may also use a layer of TiOxNy, MnO3, CrO3, V2O5, WO3, NiO, Cr2O3, SnS2, Si, and/or any other high-affinity oxide. Some embodiments may instead use a layer of titanium oxide. Layers of titanium oxide may be used that have a phase and/or crystal lattice that generates a relatively low dielectric constant in comparison to the active layer described below.

The method may also include forming an active layer (1608). The active layer may be formed on top of the tunneling layer, and may be formed using any known process for forming an active layer. In some embodiments, no intervening layers may be formed between the first tunneling layer and the active layer. Specifically, some embodiments do not include a barrier layer or a layer of silicon dioxide between the active layer and the tunneling layer. The active layer may be formed out of titanium oxide (TiOx) and/or any of its doped alloys, TaOx/T2O5 oxide or BiFeO3, and may be formed using deposition processes, such as atomic layer deposition (ALD), chemical vapor deposition (CVD), and/or the like. Some embodiments may use chromium oxide, cerium oxide, any other multi-oxidation state oxide, and/or combinations of TaOx/HfO2 instead of or in addition to TiOx as active material. The active layer may be formed to have any of the characteristics described above in this disclosure. The active layer may be doped with other materials, such as Co, C, Cr, Mo, W, C, N, Nb, Ta, Zr, Hf, S, Se, P, and/or the like, to tune the band-gap, conductivity, electron affinity and conduction band, and valence band offsets to neighboring tunneling and barrier layers. For example, the active layer may have its doping controlled to produce at least a minimum dielectric constant. Doping may be controlled by controlling the power with which titanium and/or oxygen are added to a deposition vapor. The active layer may be formed to have a dielectric constant that is at least 1.5 times larger than the tunneling layer. In some embodiments, the active layer may be formed from hafnium oxide. The active layer may be configured to have a phase and crystal lattice structure to provide a dielectric constant that is higher than the dielectric constant of the first self-rectifying layer as described above. Additional comparisons between these dielectric constants are disclosed above. A second electrode or top electrode may then be added having a higher or same work function as the first or bottom electrode (1610) as described above.

In the foregoing description, for the purposes of explanation, numerous specific details were set forth in order to provide a thorough understanding of various embodiments. It will be apparent, however, to one skilled in the art that embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of the example embodiments will provide those skilled in the art with an enabling description for implementing an example embodiment. It should be understood that various changes may be made in the function and arrangement of elements without departing from the spirit and scope of various embodiments as set forth in the appended claims.

Specific details are given in the foregoing description to provide a thorough understanding of the embodiments. However, it will be understood by one of ordinary skill in the art that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

In the foregoing specification, aspects various embodiments are described with reference to specific embodiments, but those skilled in the art will recognize that the invention is not limited thereto. Various features and aspects of the above-described embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

What is claimed is:

1. A device comprising:
   a first electrode;
   a barrier layer comprising a first dielectric constant and a first electron affinity;
   a tunneling layer comprising a second dielectric constant and a second electron affinity, wherein the barrier layer contacts and is between the first electrode and the tunneling layer, and the first electron affinity is less than the second electron affinity;
   an active layer comprising a third dielectric constant and a third electron affinity, wherein the tunneling layer contacts and is between the barrier layer and the active layer, the third dielectric constant is greater than the second dielectric constant, and the third electron affinity is less than the second electron affinity and greater than the first electron affinity; and
   a second electrode, wherein the active layer is adjacent to and between the tunneling layer and the second electrode.

2. The device of claim 1, wherein the third dielectric constant is at least 1.5 times larger than the second dielectric constant.

3. The device of claim 1, wherein the third dielectric constant is between 30 and 60.

4. The device of claim 1, wherein the third dielectric constant is 40.

5. The device of claim 1, wherein the second dielectric constant is between 8 and 25.

6. The device of claim 1, wherein the tunneling layer comprises cobalt oxide.

7. The device of claim 1, wherein the active layer comprises titanium oxide.

8. The device of claim 1, wherein the active layer comprises hafnium oxide.

9. The device of claim 1, wherein the active layer comprises cerium oxide.

10. The device of claim 1, wherein the active layer is doped with oxygen such that the third electron affinity is between 3.1 eV and 4.5 eV.

11. The device of claim 1, wherein a thickness of the tunneling layer and a thickness of the barrier layer have a ratio of 1:1.

12. The device of claim 1, wherein the first electrode comprises a first material and the second electrode comprises a second material that is different from the first material.

13. The device of claim 12, wherein a work function associated with first electrode is less than a work function associated with the second electrode.

14. The device of claim 12, wherein a work function differential between the first electrode and the second electrode is greater than 0.5 V.

15. The device of claim 12, wherein the first electrode comprises titanium nitrite and the second electrode comprises platinum.

16. The device of claim 12, wherein the first electrode comprises a first work function of 4.5 eV to 4.7 eV, and the second electrode comprises a second work function that is at least 5 eV higher than the first work function.

17. The device of claim 1, wherein the barrier layer is between 0.5 nm and 3.0 nm thick.

18. The device of claim 1, wherein the active layer is between 7.0 nm and 15.0 nm thick.

19. The device of claim 1, wherein the tunneling layer is between 1.0 nm and 3.0 nm thick.

20. The device of claim 1, wherein a ratio of thicknesses of the barrier layer, the tunneling layer, and the active layer is 1:2:9.

\* \* \* \* \*